United States Patent
Shiraishi et al.

(10) Patent No.: US 6,653,024 B1
(45) Date of Patent: Nov. 25, 2003

(54) PHOTOMASK, ABERRATION CORRECTION PLATE, EXPOSURE APPARATUS, AND PROCESS OF PRODUCTION OF MICRODEVICE

(75) Inventors: Naomasa Shiraishi, Tokyo (JP); Hitoshi Takeuchi, Tokyo (JP); Soichi Owa, Tokyo (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/569,849

(22) Filed: May 10, 2000

Related U.S. Application Data

(63) Continuation of application No. PCT/JP98/05061, filed on Nov. 10, 1998.

(30) Foreign Application Priority Data

| Nov. 11, 1997 | (JP) | 9-308342 |
| Feb. 18, 1998 | (JP) | 10-052830 |
| May 12, 1998 | (JP) | 10-146604 |
| May 26, 1998 | (JP) | 10-144303 |
| Oct. 22, 1998 | (JP) | 10-300525 |

(51) Int. Cl.[7] .................................................. G03F 9/00
(52) U.S. Cl. ........................................................ 430/5
(58) Field of Search ............................ 430/5, 322, 323, 430/324, 22; 378/34, 35

(56) References Cited

U.S. PATENT DOCUMENTS

| 4,556,608 A | * 12/1985 | Kaneki et al. ............ 428/629 |
| 5,168,001 A | * 12/1992 | Legare et al. ............ 428/194 |
| 5,326,729 A | 7/1994 | Yaba et al. |
| 5,668,672 A | 9/1997 | Oomura |
| 5,679,125 A | 10/1997 | Hiraiwa et al. ............. 65/397 |
| 5,935,735 A | * 8/1999 | Okubo et al. ................ 430/5 |
| 6,124,063 A | * 9/2000 | Dauksher et al. .......... 430/5 |
| 6,210,843 B1 | * 4/2001 | Chen et al. .................. 430/5 |

FOREIGN PATENT DOCUMENTS

| DE | 195 46 795 A1 | 6/1996 |
| EP | 0 488 320 A1 | 6/1992 |
| EP | 0 720 970 B1 | 7/1996 |
| JP | A-2-166449 | 6/1990 |
| JP | A-3-155120 | 7/1991 |
| JP | A-3-168641 | 7/1991 |
| JP | A-4-204904 | 7/1992 |
| JP | A-6-227827 | 8/1994 |
| JP | A-6-287022 | 10/1994 |
| JP | A-7-319149 | 12/1995 |
| JP | A-8-171054 | 7/1996 |

* cited by examiner

Primary Examiner—Christopher G. Young
Assistant Examiner—Saleha R. Mohamedulla
(74) Attorney, Agent, or Firm—Oliff & Berridge, PLC

(57) ABSTRACT

A photomask including a substrate comprised of fluorite (calcium fluoride ($CaF_2$)) and protective films comprised of chrome (Cr), chromium oxide (Cro), silicon oxide ($SiO_2$ or SiO), etc. and formed at regions, other than the pattern region where the pattern to be transferred is formed, which contact other members when transporting the photomask or using it for exposure.

30 Claims, 8 Drawing Sheets

PHOTOMASK, ABERRATION CORRECTION PLATE, EXPOSURE APPARATUS, AND PROCESS OF PRODUCTION OF MICRODEVICE

BACKGROUND OF THE INVENTION

1. Field of the Invention

The present invention relates to an exposure apparatus used when producing for example a semiconductor device, an imaging device, a liquid crystal display, a thin film magnetic head, or another microdevice and to a photomask and aberration correction plate used for the exposure apparatus and a process of production of such a microdevice.

2. Description of the Related Art

In the photolithographic process for producing a semiconductor device etc., use is made of an exposure apparatus to transfer a pattern image of a photomask (including reticle) on to a photosensitive substrate through a projection optical system. The photomask used for such an exposure apparatus is generally produced using silica glass (quartz glass). Silica glass has a low transmission loss of light, has resistant to temperature changes, is excellent in corrosion resistance and elastic performance, has a small coefficient of linear expansion (about $5.5 \times 10^{-7}$/K), and has other superior properties. It therefore has the advantages of enabling formation of a pattern with a high precision and a good work efficiency. Semiconductor integrated circuits of increasing miniaturization are being developed. In the photolithographic process, the wavelengths of the light sources used are becoming increasingly shorter. Vacuum ultraviolet light, in particular, light of wavelengths shorter than 200 nm, for example, light of ArF excimer lasers (wavelength 193 nm) or $F_2$ lasers (wavelength 157 nm), etc. has now come into use as exposure light.

If ordinary silica glass is used for light of a wavelength less than about 200 nm, however, the transmission loss increases due to absorption and scattering. Further, the optical performance declines due to heat buildup resulting from absorption and to the fluorescence. The glass itself discolors along with time, that is, "color center" occurs, and changes in density, that is, "compaction", occurs. These become more remarkable the shorter the wavelength. Therefore, when using ordinary silica glass, it has been thought that use for light of a wavelength about that of an ArF excimer laser (wavelength 193 nm) was the limit. It was generally considered difficult to use a photomask made of ordinary silica glass for light of shorter wavelengths. Therefore, production of a photomask using fluorite ($CaF_2$), a material with a high transmittance even with respect to light of a wavelength less than about 200 nm, has been studied. Note that the use of fluorite is considered particularly effective when used for light of a wavelength less than 190 nm, but use of fluorite is also preferable in the case of the above ArF excimer laser from the viewpoint of the transmittance.

The Mohs hardness of fluorite, however, is 4. This is softer than the Mohs hardness 7 of quartz, the material used for photomask substrates in the past. Use as a photomask is problematic in that the photomask is susceptible to damage during transport and the dust generated from the damaged locations is liable to cause unwanted foreign matter to deposit on the pattern and prevent exposure of the desired pattern. Therefore, when producing a photomask using fluorite, measures have to be taken against this. Further, fluorite has a low resistance to temperature changes, is fragile and easily scratched, is damaged during the process of pattern formation, and has a higher coefficient of linear expansion compared with quartz, so special control and countermeasures are required for forming a mask pattern with a high precision. Further, when used for an exposure apparatus for actual exposure work, the temperature has to be controlled extremely strictly. Sometimes obstacles arise in transferring a pattern on a photosensitive substrate with a higher precision.

The above problems relate to the photomask per se. The exposure apparatus is sometimes equipped with a fixed or detachable transparent aberration correction plate in the path of the imaging light between the photomask and photosensitive substrate (for example, between the photomask and projection optical system) so as to correct distortion resulting from distortion of the projection optical system or other aberration. Similar problems arise as with the above photomask for this aberration correction plate as well. Further, the problems relating to the photomask and aberration correction plate hinder shortening of the wavelength of the exposure apparatus, make dealing with the increasing miniaturization of patterns to be formed on photosensitive substrates difficult, and make realization of stable exposure performance over time and provision of an exposure apparatus with a long service life hard.

SUMMARY OF THE INVENTION

Accordingly, a first object of the present invention is to provide a photomask produced using a material, such as fluorite, having a low hardness to enable the exposure wavelength to be shortened further and a finer pattern to be transferred, yet which is not damaged when transporting the photomask or at the time of scan exposure.

A second object of the present invention is to provide a photomask, used for an exposure apparatus using light of a particularly short wavelength (wavelength of not more than about 200 nm) for exposure, which is high in light transmittance, excellent in UV resistance, good in processability, and enables realization of a high precision.

A third object of the present invention is to provide an aberration correction plate, used for an exposure apparatus using light of a particularly short wavelength (wavelength of not more than about 200 nm) for exposure, which is high in light transmittance, excellent in UV resistance, good in processability, and enables realization of a high precision.

A fourth object of the present invention is to provide an exposure apparatus able to handle the increasing miniaturization of patterns formed on photosensitive substrates, feature low deterioration of the exposure performance along with time, and having a long service life.

A fifth object of the present invention is to provide a process for production of a microdevice of a good quality.

1. To achieve the first object, according to the present invention, there is provided a photomask including a substrate, a transfer pattern formed on the substrate, and a protective film formed on the substrate for protecting the substrate. The protective film may be formed, in a region of the outer surface of the substrate other than the region at which the transfer pattern is formed, at a contact surface with a member for holding the photomask and at least at a part of the area near the contact surface.

According to the photomask of the present invention, since a protective film is formed for protecting the substrate of the photomask, even if the photomask is produced using a material, such as fluorite, with a low hardness, the photomask will not be damaged during transport of the photomask or during scan exposure. The photomask is preferably irradiated with illumination light of a wavelength not more than 190 nm. In this case, it is possible to transfer an extremely finer pattern using extreme ultraviolet illumination light of a wavelength not more than 190 nm. The substrate of the photomask is preferably formed by calcium fluoride ($CaF_2$). Note that fluorite is a typical example of this. In this case, it is possible to use extreme ultraviolet exposure light such as light of an $F_2$ excimer laser (wavelength 157 nm). The protective film is preferably comprised of chrome (Cr), chromium oxide (CrO), or silicon oxide ($SiO_2$ or SiO). In this case, it is possible to keep down the cost for forming the protective film for preventing damage of the photomask.

The protective film may be formed by the same material as the pattern. Further, the protective film may be provided at the surface of the substrate on which the pattern is formed or on an end face of the substrate.

2. To achieve the second object, according to the present invention, there is provided a photomask, used for an exposure apparatus having a light source emitting illumination light of a wavelength not more than about 200 nm, including a substrate comprised of fluorine-doped silica glass and a pattern formed on that substrate. The silica glass may be produced by hydrolyzing a silicon compound in a flame, causing the glass particles obtained to deposit to form porous glass, heat treating the porous glass in a fluorine-containing atmosphere to dope it with fluorine, then making it transparent.

Fluorine-doped silica glass has incomplete structures (bonds) in the glass terminated by fluorine, so becomes more complete in structure. There is therefore less absorption of ultraviolet light and the structure is stably maintained even if exposed to the strong energy of ultraviolet rays. Therefore, a photomask high in light transmittance and with little deterioration along with time due to exposure to ultraviolet rays (color center, compaction, etc.) when using ultraviolet rays of a wavelength not more than about 200 nm as the illumination light is provided. Further, compared with a photomask produced using fluorite, there is resistance to heating and cooling and resistance to scratching, so the work efficiency at the time of production, including pattern formation, is good and the coefficient of linear expansion is extremely small. Consequently, a high precision photomask is provided.

Further, the silica glass is preferably further doped with hydrogen. This is because by doping with hydrogen in addition to fluorine, bonds which are cleaved by exposure to ultraviolet rays are terminated by the doped hydrogen atoms, so the UV resistance can be further improved and, by doing this, a photomask with little deterioration due to exposure to ultraviolet rays is provided. Further, the concentration of OH groups in the silica glass is preferably not more than 100 ppm. This is because when using the photomask of the present invention in an exposure apparatus provided with a light source emitting illumination light of a wavelength not more than about 170 nm, keeping down the concentration of OH groups in the silica glass to less than 100 ppm enables an improvement of the transmittance with respect to such short wavelength light.

3. To achieve the second object, according to the present invention, there is provided a photomask, used for an exposure apparatus provided with a light source emitting illumination light of a wavelength not more than about 200 nm, including a substrate produced using silica glass having a structure determining temperature of not more than 1200 K and an OH group concentration of not less than 1000 ppm and a pattern formed on the substrate.

Silica glass containing not less than 1000 ppm of OH groups is structurally stable compared with other silica glass and tends to have a lower structure determining temperature. Further, a low structure determining temperature is believed to mean less distorted bonded portions in the glass, so there is less cleavage of distorted bonded portions due to exposure to ultraviolet rays and therefore less of a scattering loss or absorption loss and an improvement of the UV resistance. Accordingly, there is provided a photomask with a high light transmittance and low deterioration along with time due to exposure to ultraviolet rays (color center, compaction, etc.) when using ultraviolet rays of a wavelength not more than about 200 nm as the exposure light. Further, compared with a photomask produced using fluorite, there is resistance to heating and cooling and resistance to scratching, so the work efficiency in production, including pattern formation, is excellent and the coefficient of linear expansion is extremely small. Therefore, a high precision photomask is provided.

Note that the "structure determining temperature" spoken of here is a factor introduced as a parameter expressing the structural stability of silica glass. The fluctuation in density of silica glass at room temperature, that is, the structural stability, is determined by the density and structure when the silica glass in the molten state at a high temperature freeze near the glass transition point in the process of cooling. That is, the thermodynamic density and structure corresponding to the temperature at which the density and structure freeze are preserved even under room temperature. The temperature at which the density and structure freeze is defined as the "structure determining temperature".

4. To achieve the second object, according to the present invention, there is provided a photomask, used for an exposure apparatus having a light source emitting illumination light of a wavelength not more than about 200 nm, including a substrate comprised of a thin sheet of silica glass, a pattern formed on the substrate, and a reinforcing member, for holding the substrate so as to prevent deformation of the substrate, comprised of a material having a transmittance at least equal to the substrate at least at the area where the illumination light passes. The silica glass is preferably fixed so that the surface on which the pattern is formed is in substantially close contact with the reinforcing member. As the material of the reinforcing member, any of fluorine-doped silica glass, silica glass with an OH group concentration of not less than 1000 ppm, calcium fluoride, rock crystal, and magnesium fluoride may be used.

The loss of light passing through the silica glass becomes larger in proportion to the thickness of the glass, so the glass is made a thin sheet and the pattern formed on there so as to reduce the transmission loss at that portion. Further, by holding the thin sheet of silica glass by a reinforcing member comprised of a material having a transmittance at least equal to that of the silica glass at least at the area where the illumination light passes, the low strength resulting from the thin sheet shape is compensated for and flexing etc. are prevented. Since the pattern is formed on the thin sheet of silica glass, there is little loss even when using ultraviolet rays of a wavelength not more than about 200 nm as the illumination light. Further, there is less deterioration due to heating and cooling and the coefficient of linear expansion is small as well, so a high precision pattern can be easily formed. Further, the silica glass on which the pattern is formed is reinforced by a reinforcing member, so there is little flexing and a photomask high in precision and excellent in characteristics is provided. The silica glass is preferably doped with fluorine. This is because by doping the thin sheet of silica glass with fluorine, the transmission loss can be further reduced and the UV resistance can be improved.

5. To achieve the fourth object, according to the present invention, there is provided an exposure apparatus comprising an illumination optical system for emitting illumination light of a wavelength of less than about 200 nm to a photomask, a projection optical system for projecting the illumination light emitted from the photomask on to a photosensitive substrate, a stage arranged at the object plane side of the projection optical system and moving the photomask substantially along the object plane, and a reinforcing member, provided at the stage for holding the photomask and preventing its deformation, comprised of a material having a transmittance at least equal to that of the photomask at least at an area through which the illumination light passes. The photomask is preferably fixed so that the surface on which the pattern is formed is substantially in close contact with the reinforcing member. As the material of the reinforcing member, any of fluorine-doped silica glass, silica glass with an OH group concentration of not less than 1000 ppm, calcium fluoride, rock crystal, and magnesium fluoride may be used.

According to this exposure apparatus, since the photomask is held by a reinforcing member comprised of a material having a transmittance at least equal to it, flexing or other deformation of the photomask are prevented and therefore a high precision of pattern transfer can be realized. Further, since flexing and other deformation are prevented even if the photomask is made thin, it is possible to reduce the transmission loss without inviting a drop in precision.

6. To achieve the third object, according to the present invention, there is provided an aberration correction plate of a projection optical system, projecting an image of a pattern to be exposed to illumination light of a wavelength not more than about 200 nm on to a predetermined surface, produced using fluorine-doped silica glass or silica glass having a structure determining temperature of not more than 1200 K and an OH group concentration of not less than 1000 ppm.

Fluorine-doped silica glass has incomplete structures (bonds) in the glass terminated by fluorine, so becomes more complete in structure. There is therefore less absorption of ultraviolet light and the structure is stably maintained even if exposed to the strong energy of ultraviolet rays. Further, silica glass containing not less than 1000 ppm of OH groups is structurally stable compared with other silica glass and tends to have a lower structure determining temperature. Further, a lower structure determining temperature is believed to mean less distorted bond portions in the glass, therefore there is less cleavage of distorted bond portions due to exposure to ultraviolet rays and therefore there is less scattering loss or absorption loss and the UV resistance is improved. Therefore, an aberration correction plate high in light transmittance and with little deterioration along with time due to exposure to ultraviolet rays (color center, compaction, etc.) when using ultraviolet rays of a wavelength not more than about 200 nm as the illumination light is provided. Further, since it is scratch resistant, the work efficiency at the time of production, including the grinding to a shape to deal with the distribution of distortion, is good and the coefficient of linear expansion is extremely small, so an aberration correction plate which can correct aberration with a high precision is provided.

7. To achieve the fourth object, according to the present invention, there is provided an exposure apparatus comprising an illumination optical system for emitting illumination light of a wavelength not more than about 200 nm to a photomask, a projection optical system for projecting the illumination light emitted from the photomask on to a photosensitive substrate, and an aberration correction plate, comprised of fluorine-doped silica glass, for correcting nonrotationally symmetric aberration of the projection optical system and arranged in the path of imaging light between the photomask and photosensitive substrate.

According to this exposure apparatus, since provision is made of an aberration correction plate using a predetermined silica glass and this aberration correction plate has the superior characteristics of a high light transmittance with respect to irradiation by ultraviolet rays of a wavelength not more than about 200 nm and little deterioration along with time, it is possible to correct aberration stably over time. Therefore, it is possible to realize a high exposure precision over a long period, improve the reliability of the apparatus, and increase the service life.

8. To achieve the second object, according to the present invention, there is provided a photomask comprising a substrate comprised of a sheet of rock crystal and a pattern formed on the substrate.

Rock crystal, that is, crystallized quartz, has a low absorption even in the vacuum ultraviolet spectrum (same for infrared spectrum and visible light spectrum) and can maintain its structure even if exposed to the strong energy of ultraviolet rays. Therefore, a photomask high in light transmittance and with little deterioration along with time due to exposure to ultraviolet rays even when using ultraviolet rays of an extremely short wavelength (for example, a wavelength not more than about 200 nm) as the illumination light is provided. Further, compared with a photomask produced using fluorite, there is resistance to heating and cooling and resistance to scratching, so the work efficiency at the time of production, including pattern formation, is good and the coefficient of linear expansion is small. Consequently, a high precision photomask is provided.

9. To realize the fourth object, according to the present invention, there is provided an exposure apparatus comprising a photomask formed with a pattern to be transferred to a rock crystal sheet, an illumination optical system for emitting illumination light to the photomask, and a projection optical system for projecting the illumination light emitted from the photomask on to a photosensitive substrate.

The photomask used for the exposure apparatus of the present invention is comprised of rock crystal, that is, crystallized quartz. Rock crystal has a low absorption even in the vacuum ultraviolet spectrum and can maintain its structure even if exposed to the strong energy of ultraviolet rays. Further, as the light source, it is possible to use one emitting ultraviolet rays of an extremely short wavelength (for example, a wavelength not more than about 200 nm), so it is possible to deal with the increasing miniaturization of patterns formed on photosensitive substrates, stably maintain the exposure performance over a long period, and increase the service life.

10. To achieve the fifth object, according to the present invention, there is provided a process of production of a microdevice comprising bringing a protective film formed on a mask together with a circuit pattern into contact with a projection to hold the mask, emitting illumination light of a wavelength not more than about 200 nm to the held mask, using the illumination light from through the mask for exposing a photosensitive layer on the substrate on which the microdevice is to be formed, and thereby transferring the circuit pattern on to the substrate.

According to this process of production of a microdevice of the present invention, since the pattern is transferred while holding the mask by bringing a projection into contact with a portion on which the protective film is formed, damage and generation of dust along with holding the mask are prevented, deposition of broken pieces etc. on the mask or other optical elements etc. and formation of a poor pattern are prevented, and a microdevice having good quality can be produced.

11. To achieve the fifth object, according to the present invention, there is provided a process of production of a microdevice comprising emitting illumination light of a wavelength not more than about 200 nm on a mask made using any of fluorine-doped silica glass, silica glass with an OH group concentration of not less than 1000 ppm, magnesium fluoride, and rock crystal, using the illumination light from the mask for exposing a photosensitive layer on a substrate on which the microdevice is to be formed, and thereby transferring the pattern of the mask on the substrate. In this case, when illuminating the photosensitive layer through a projection optical system and using a mask comprised of rock crystal, the mask should be arranged so that its optical axis becomes substantially parallel with the optical axis of the projection optical system.

According to the process of production of a microdevice of the present invention, there is little deterioration of the mask over time even if using illumination light of a short wavelength, so it is possible to produce high quality microdevices stably over a long period.

DESCRIPTION OF THE PREFERED EMBODIMENTS

The present invention will be explained in more detail next in accordance with the attached drawings.

First Embodiment

Figure 1A:
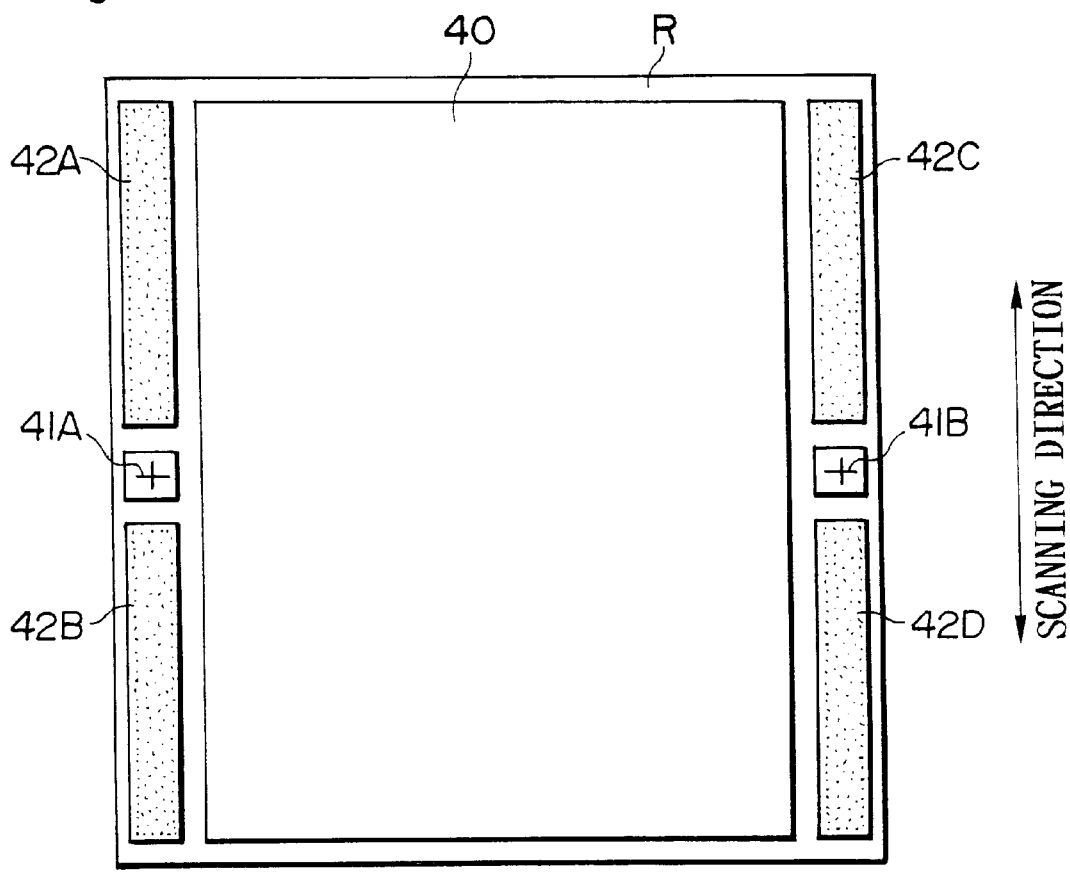
FIG. 1a is a bottom view of a reticle of a first embodiment of the present invention.
Figure 1B:
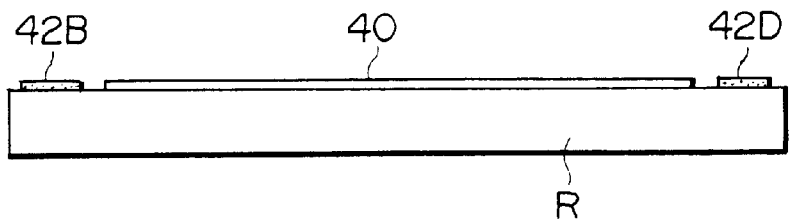
FIG. 1b is a side view of the reticle of the first embodiment of the present invention.

Below, a first embodiment of the present invention will be explained with reference to FIG. 1a and FIG. 1b. FIG. 1a shows the pattern surface of a reticle R of the present example used as a photomask, while FIG. 1b is a side view of the same. In FIG. 1a and FIG. 1b, the reticle R is comprised of a flat substrate made of fluorite as the calcium fluoride ($CaF_2$) on which a pattern to be transferred, predetermined protective films, etc. are formed. That is, the pattern to be transferred is formed at a pattern region 40 at the center of the pattern surface (bottom surface) of the reticle R. Further, at the two sides of the pattern region 40 are formed reticle alignment marks 41A and 41B for positioning the reticle R with respect to the exposure apparatus (pattern transfer apparatus). Further, above and below the reticle alignment marks 41A and 41B are for example formed protective films 42A to 42D comprised of the same material as the material forming the pattern to be transferred.

Normally, when a reticle R is mounted in an exposure apparatus, positional offset of the reticle R during the exposure operation is prevented by having the reticle R held by suction by a reticle holder at predetermined areas in the plane at the pattern region 40 side. The reticle R of this example is formed with protective films 42A to 42D at the regions held by suction, therefore the surface of the reticle R held by suction is covered by the protective films 42A to 42D. Further, when loading the reticle R of this example in a scan exposure apparatus, the direction parallel to the axis of symmetry of the reticle alignment marks 41A and 41B becomes the scanning direction.

Since the protective films are formed on the suction held surfaces of the reticle R of this example, even if the reticle uses a substrate of a soft material such as fluorite, there is no damage etc. at the time of contact with the exposure apparatus and, further, foreign matter produced when damage is caused and deposition of the foreign matter on the pattern surface can be completely prevented. Further, since the reticle R is generally transported and held with the regions of the reticle R on which the protective films 42A to 42D are formed in contact with the reticle loader or case, not only at the time of exposure, but also at the time of loading the reticle R into the exposure apparatus and unloading the reticle R from the exposure apparatus or in the state with the reticle R held in a case, the protective films 42A to 42D can prevent damage and generation of dust at these stages.

Note that the regions at which the protective films 42A to 42D are formed are positioned differently from the pattern region 40 on which the pattern to be transferred is drawn, so the material of the protective films 42A to 42D may also be one through which exposure light cannot pass. For example, it is also possible to use diamond grown by CVD (chemical vapor deposition). Further, there is the advantage that the production costs can be lowered when using silicon oxide ($SiO_2$ or SiO). When using chrome (Cr), chromium oxide (Cro), or molybdenum silicide (for example, $MoSi_2$), the same as the pattern to be transferred, for the material of the light shielding pattern used for the pattern region 40, it is possible to form the protective films 42A to 42D at the same time as the formation of the pattern region 40, so there is the advantage that the film formation process is simplified and the production costs can be reduced. In this example, fluorite was used as the material of the substrate of the reticle R, but even when using silica glass doped with phosphorus (P) or the later mentioned fluorine (F) having a high transmittance with respect to extreme ultraviolet rays, formation of the protective films 42A to 42D enables prevention of damage at the time of transport of the reticle R or the time of scan exposure.

Figure 2A:
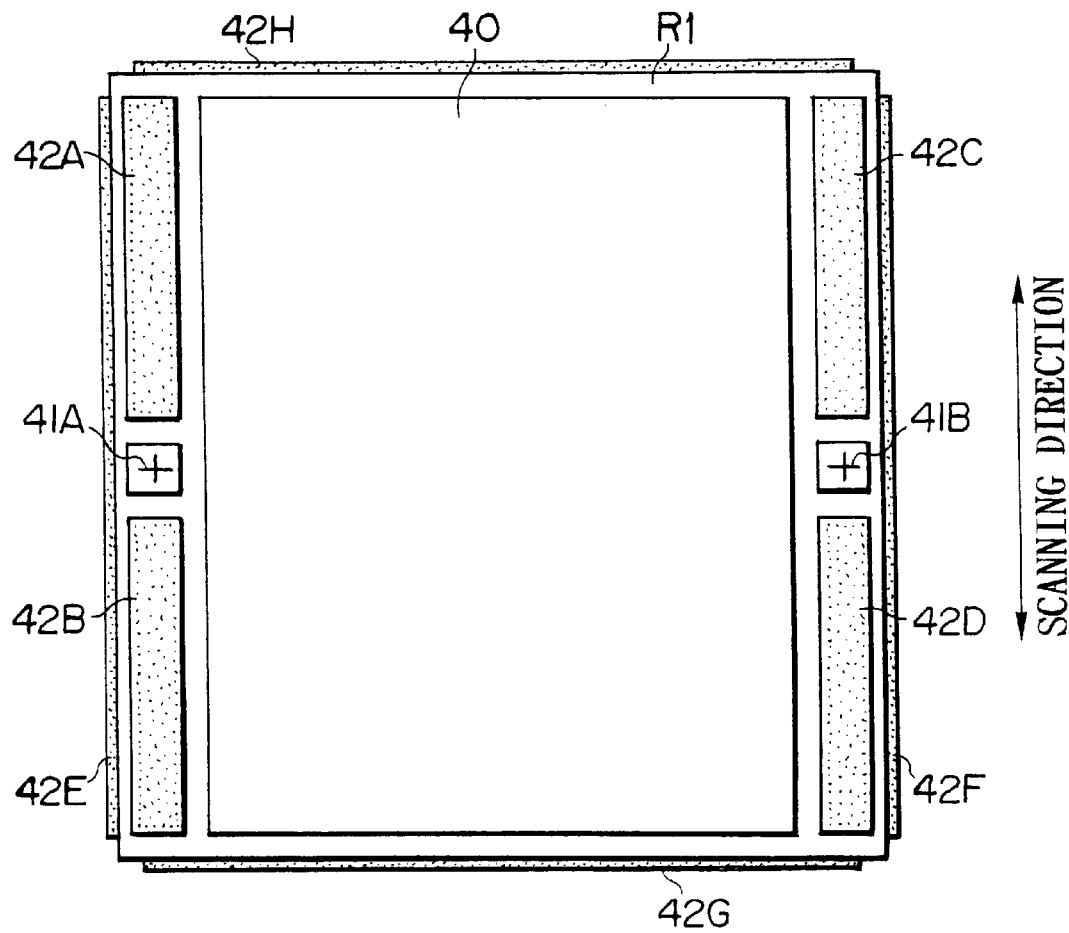
FIG. 2a is a bottom view of a reticle partially improved from the first embodiment of the present invention.
Figure 2B:
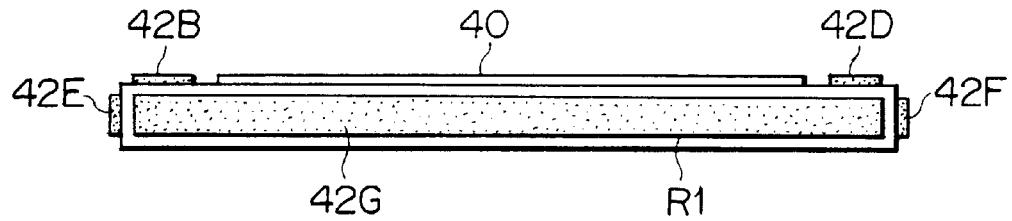
FIG. 2b is a side view of a reticle partially improved from the first embodiment of the present invention.

Next, an example of an improvement of the photomask of the first embodiment will be explained with reference to FIG. 2a and FIG. 2b. FIG. 2a and FIG. 2b show a reticle R1 formed with protective films 42E, 42F, 42G, and 42H at the side faces as well. By forming the protective films 42E to 42H at the side faces of the reticle R1, damage to the reticle can be prevented when the side faces of the reticle contact other members during inspection of the reticle for defects etc. By forming protective films at all locations where the reticle contacts other members in this way, it is possible to completely prevent damage to the reticle.

Next, an example of the method of use of the reticle of the above embodiment will be explained. Below, an explanation will be made, with reference to FIG. 3, of the case of exposure by a step-and-scan type projection exposure apparatus using the reticle R shown in FIG. 1a and FIG. 1b.

Figure 3:
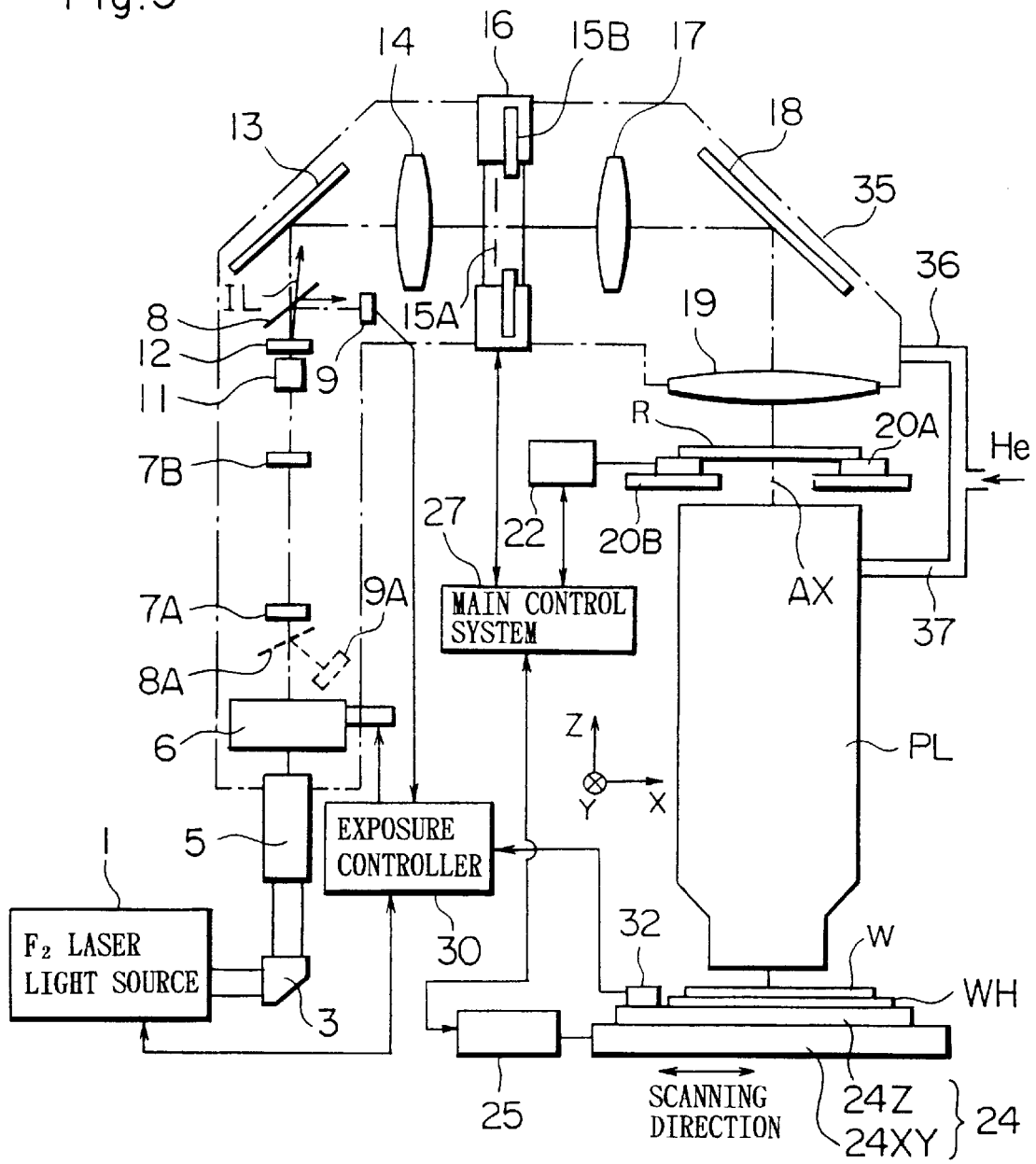
FIG. 3 is a view of the general configuration of a projection exposure apparatus of the first embodiment of the present invention.

FIG. 3 shows the general configuration of a projection exposure apparatus of this example. In FIG. 3, ultraviolet pulse light IL, constituting the exposure light, emitted from an $F_2$ laser light source 1, having a wavelength of 157 nm, and narrowed in band travels via a beam matching unit (BMU) 3 including a movable mirror etc. for matching the position of the light path with the exposure apparatus proper and strikes a variable light attenuator 6 constituting the light attenuator. An exposure controller 30 for controlling the amount of exposure of a resist on a wafer controls the starting and stopping of emission of light by the $F_2$ laser light source 1 and the output as determined by the oscillation frequency and pulse energy and adjusts, in steps or continuously, the light attenuation rate on the ultraviolet pulse light in the variable light attenuator 6. Note that the present invention may also be applied when using ArF excimer laser light of a wavelength of 193 nm or other laser light of a wavelength of not more than about 250 nm as the exposure light.

The ultraviolet pulse light IL passing through the light attenuator 6 passes through a beam shaping optical system comprised of lens systems 7A and 7B arranged along a predetermined light path and strikes a fly's-eye lens 11. In the present example, there is one fly's-eye lens 11, but the illumination uniformity may be improved, as shown in for example Japanese Unexamined Patent Publication (Kokai) No. 1-235289 and its corresponding U.S. Pat. No. 5,307,207, by providing two fly's-eye lenses in series. An aperture system 12 of the illumination system is arranged at the exit side of the fly's-eye lens 11. The aperture system 12 is arranged to enable a circular aperture for normal illumination, an aperture for modified illumination comprised of a plurality of small off-center openings, an aperture for ring-type illumination, etc. to be switched between. The ultraviolet pulse light IL emitted from the fly's-eye lens 11 and passing through a predetermined aperture of the aperture system 12 strikes the high transmittance, low reflectance beam splitter 8. The ultraviolet pulse light reflected at the beam splitter 8 strikes an integrator sensor 9 comprised of a photoelectric detector. The detection signal of the integrator sensor 9 is supplied to the exposure controller 30. Note that instead using a fly's-eye lens as the optical integrator (homogenizer) or along with the fly's-eye lens, it is possible to use a rod integrator.

The transmittance and reflectance of the beam splitter 8 are measured in advance to a high precision and stored in a memory of the exposure controller 30. The exposure controller 30 is configured to be able to indirectly monitor the amount of ultraviolet pulse light IL striking the projection optical system PL and its integral by the detection signal of the integrator sensor 9. Note that to monitor the amount of light striking the projection optical system PL, as shown by the dotted line in FIG. 3, for example, a beam splitter 8A may be arranged in front of the lens system 7A, the reflected light from the beam splitter 8A received by the photoelectric detector 9A, and the detection signal of the photodetector 9A supplied to the exposure controller 30.

The ultraviolet pulse light IL passing through the beam splitter 8 travels via a condenser lens system 14 to strike a fixed illumination field aperture (fixed blind) 15A in a reticle blind mechanism 16. The fixed blind 15A, for example as disclosed in Japanese Unexamined Patent Publication (Kokai) No. 4-196513 and its corresponding U.S. Pat. No. 5,473,410, has a straight slit shape or rectangular shaped opening (hereinafter referred to overall as a "slit shape") arranged to extend in a direction perpendicular to the direction of scan exposure at the center of the circular field of the projection optical system PL. Further, inside the reticle blind mechanism 16 is provided a movable blind 15B for changing the width of the illumination field area in the direction of scan exposure separate from the fixed blind 15A. The movable blind 15B enables a reduction of the stroke of the scan motion of the reticle stage and a reduction of the width of the light shielding strip of the reticle 9. Information of the opening rate of the movable blind 15B is supplied to the exposure controller 30 as well. The value of the amount of incident light found from the detection signal of the integrator sensor 9 multiplied by the opening rate is the actual amount of light incident on the projection optical system PL.

The ultraviolet pulse light IL shaped to a slit by the fixed blind 15A of the reticle blind mechanism 16 travels via an imaging lens system 17, reflection mirror 18, and main condenser lens system 19 to illuminate an illumination field resembling the slit-like opening of the fixed blind 15A on the circuit pattern field of the reticle R by a uniform intensity. That is, the opening constituted by the fixed blind 15A and movable blind 15B is located on or nearby a conjugate plane to the pattern surface of the reticle R due to the composite system of the imaging lens system 17 and main condenser lens system 19.

Under the ultraviolet pulse light IL, the image of the circuit pattern in the illumination field of the reticle R is transferred through the double-sided telecentric projection system PL to the slit-shaped exposure field of the resist layer on the wafer W arranged at the imaging plane of the projection optical system PL by a predetermined projection magnification $\beta$ ($\beta$ is for example ¼, ⅕, etc.). This exposure field is located on one shot region among the plurality of shot regions on the wafer W. The projection optical system PL of this example is a dioptrics system (refraction system), but of course a catadioptrics system (reflection-refraction system) may also be used. Below, the explanation will be given setting the Z-axis parallel to the optical axis AX of the projection optical system PL, the X-axis in the scan direction in the plane perpendicular to the Z-axis (direction parallel to surface of paper of FIG. 3), and the Y-axis the non-scanning direction orthogonal to the scanning direction (direction perpendicular to surface of paper of FIG. 3).

At this time, the reticle R is held by suction by a reticle holder 20A at areas where the protective films 42A to 42D are formed. The reticle stage 20A is carried on a reticle base 20B so as to be able to move at an equal speed in the X-direction and so as to be able to be moved finely in the X-direction, Y-direction, and direction of rotation. The two-dimensional position and angle of rotation of the reticle stage 20A (reticle R) are measured in real time by a laser interferometer in a drive control unit 22. Based on the measured results and control information from a main control system 27 comprised of a computer in overall control of the operation of the apparatus as a whole, a drive motor (linear motor or voice coil motor etc.) in the drive control unit 22 controls the scan velocity and position of the reticle stage 20A.

When aligning the reticle R, the center of the pair of reticle alignment marks 41A and 41B is set to about the center of the exposure field of the projection optical system PL. In that state, the reticle alignment marks 41A and 41B are illuminated by illumination light of the same wavelength as the exposure light IL. The images of the reticle alignment marks 41A and 41B are formed near alignment marks (not shown) on the wafer stage 24. By detecting the amount of offset of an alignment mark on the wafer stage 24 with respect to the image of a reticle alignment mark 41A or 41B by a reticle alignment microscope (not shown) and positioning the reticle stage 20A to correct this offset, the reticle R can be positioned with respect to the wafer W. At this time, by observing a corresponding reference mark by an alignment sensor (not shown), the interval (base line amount) from the center of detection of the alignment sensor to the center of the pattern image of the reticle R is calculated. When performing overlay exposure on the wafer W, the wafer stage 24 is driven based on the position obtained by correcting the results of detection by the alignment sensor by that base line amount thereby enabling scan exposure of the pattern image of the reticle R to the shot regions on the wafer W with a high overlay accuracy.

On the other hand, the wafer W is held by suction by the wafer holder WH on a Z-tilt stage 24Z. The Z-tilt stage 24Z is fixed on an XY-stage 24XY moving two-dimensionally along an XY-plane parallel to the image plane of the projection optical system PL. The wafer stage 24 is comprised by the Z-tilt stage 24Z and the XY-stage 24XY. The Z-tilt stage 24Z controls the focus position (Z-direction position) and tilt angle of the wafer W to bring the surface of the wafer W into register with the image plane of the projection optical system PL by an auto focus system and auto leveling system, while the XY-stage 24XY performs an equal speed scan in the X-direction of the wafer W and stepping in the X-direction and Y-direction. The two-dimensional position and angle of rotation of the Z-tilt stage 24Z (wafer W) are measured in real time by a laser interferometer in a drive control unit 25. Based on the measured results and control information from the main control system 27, a drive motor (linear motor etc.) in the drive control unit 25 controls the scan velocity and position of the XY-stage 24XY. The rotational error of the wafer W is corrected by rotating the reticle stage 20A through the main control system 27 and drive control unit 22.

The main control system 27 sends the movement position, movement velocity, movement acceleration, positional offset, and other various information for the reticle stage 20A and XY-stage 24XY to the drive control units 22 and 25. At the time of scan-exposure, the reticle R is made to scan the illumination field of the ultraviolet pulse light IL through the reticle stage 20A in the +X-direction (or −X-direction) at a velocity Vr and, synchronously with this, the wafer W is made to scan the exposure field of the pattern image of the reticle R through the XY-stage 24XY in the −X-direction (or +X-direction) at a velocity $\beta \cdot vr$ ($\beta$ is the projection magnification from the reticle R to the wafer W).

Further, the main control system 27 controls the movement of the blades of the movable blind 16B provided in the above reticle blind mechanism 16 for synchronization with the movement of the reticle stage 20A at the time of scan exposure. Further, the main control system 27 linked with the exposure controller 30 sets various exposure conditions for scan exposure of the photo resist of the shot regions on the wafer W by a suitable amount of exposure and executes the most suitable exposure sequence. That is, when an instruction for starting scan exposure of one shot region on the wafer W is sent from the main control system 27 to the exposure controller 30, the exposure controller 30 starts the emission of light by the $F_2$ laser light source 1 and calculates the integral of amount of light incident on the projection optical system PL through the integrator sensor 9. Further, the exposure controller 30 sequentially calculates the transmittance of the projection optical system PL from the integral of the amount of incident light and controls the output of the illumination system 1 (oscillation frequency and pulse energy) and the light attenuation rate of the variable light attenuator 6 based on the transmittance so as to obtain a suitable amount of exposure at all points of the resist on the wafer W after scan exposure. When finishing the scan exposure of the shot regions, the emission of light by the $F_2$ laser light source 1 is stopped.

Further, an illumination amount monitor 32 comprised of a photoelectric detector is provided near the wafer holder WH on the Z-tilt stage 24Z in this example. The detection signal of the illumination amount monitor 32 is also supplied to the exposure controller 30. The illumination amount monitor 32 is provided with a light receiving face of a size covering the entirety of the exposure field by the projection optical system PL. By driving the XY-stage 24XY to set the light receiving face at a position covering the exposure field of the projection optical system PL, the amount of ultraviolet pulse light IL passing through the projection optical system PL can be measured. In this embodiment, the detection signals of the integrator sensor 9 and the illumination amount monitor 32 are used to measure the transmittance of the projection optical system PL. Note that instead of the illumination amount monitor 32, it is possible to use an illumination uniformity sensor having a pinhole shaped light receiving part for measuring the distribution of light in the exposure field.

In this embodiment, since the $F_2$ laser light source 1 is used, a subchamber 35 is provided for shielding the light paths from the pipe 5 to the variable light attenuator 6, lens systems 7A and 7B, and further fly's-eye lens 11 to main condenser lens system 19 from the outside air. The inside of the subchamber 35 is supplied through a pipe 36 with helium gas (He) with an oxygen content kept extremely low. Similarly, the entirety of the space inside the barrel of the projection optical system PL (space between plurality of lens elements) is supplied through a pipe 37 with helium gas. While not shown in the figure, helium gas is also supplied to the inside of the $F_2$ laser light source 1.

The helium gas does not have to be supplied that often once the atmospheric air is completely replaced by it if the subchamber 35 or barrel of the projection optical system PL is highly air-tight. Considering the fluctuations in transmittance caused by deposition of water molecules, hydrocarbon molecules, silicon-based organics, etc. caused from the various substances in the light path (glass, coatings, adhesives, paint, metals, ceramics, etc.) on the surfaces of the optical elements, however, it is necessary to provide a forced flow of temperature-controlled helium gas in the light path and use a chemical filter or electrostatic filter to remove these impurity molecules.

As explained above, the reticle R of the present example is formed with protective films at locations where the reticle contacts other members due to suction holding etc., so there are the advantages that the reticle is not damaged during scan exposure and the scan velocity may be made high in speed. Further, even when used for a lump exposure type (stationary exposure type) projection exposure apparatus, there is the advantage that damage to the reticle during transport etc. can be prevented by the protective films. Therefore, even in the case of a reticle produced using a material such as fluorite with a low hardness, the reticle will not be damaged during transport of the reticle or during scan exposure, it is possible to use fluorite, which is able to pass extreme ultraviolet exposure light such as that of an $F_2$ laser as the material of the photomask, the exposure wavelength used by the exposure apparatus can be made shorter, and a finer pattern can be transferred. In particular, in the case of using the reticle for a scan exposure apparatus, there is the advantage that the scan velocity can be raised and the throughput can be improved. When the protective film is made by chrome (Cr) or chromium oxide (CrO), the light shielding pattern and the protective film may be made of the same materials and the protective film may be formed simultaneously with the formation of the light shielding pattern, so the film formation process becomes simplified and more economical. When the protective film is comprised of silicon oxide ($SiO_2$ or SiO), acquisition of the silicon oxide is easy, so there is the advantage that the cost for forming the protective film can be held down.

Second Embodiment

1. Overall Configuration

Figure 4:
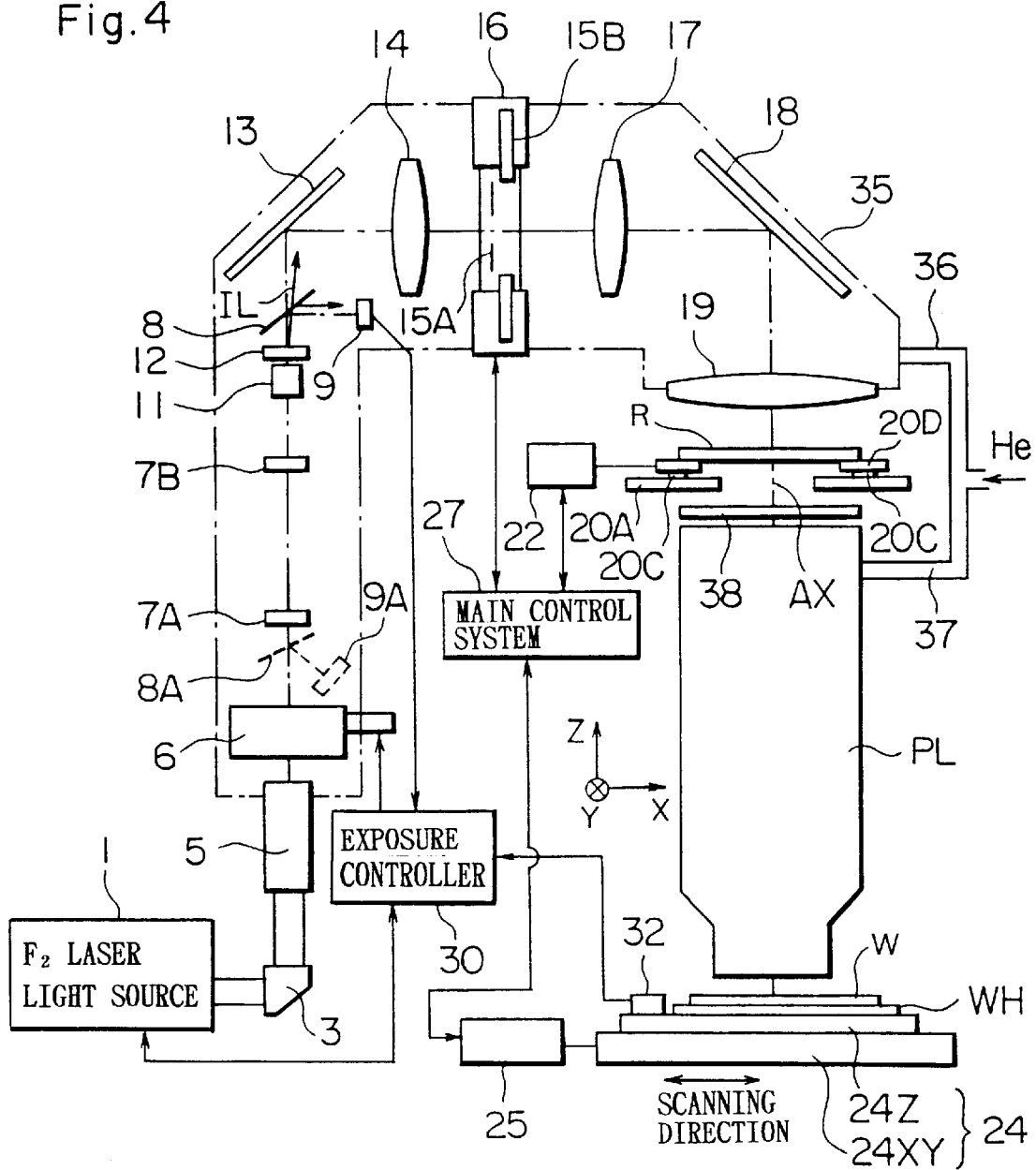
FIG. 4 is a view of the general configuration of a projection exposure apparatus of the second embodiment of the present invention.

FIG. 4 is a view of the general configuration of a step-and-scan type projection exposure apparatus of a second embodiment of the present invention. Parts of substantially the same configuration as the first embodiment (FIG. 3) are assigned the same reference numerals and explanations thereof are omitted.

The difference from the projection exposure apparatus explained in the first embodiment (FIG. 3) is that the reticle holder 20D for holding the reticle R by suction is carried on the reticle stage 20A through a plurality of (for example, four) expandable and contractible drive elements (piezoelectric elements etc.) 20C. Note that in FIG. 4, the illustration of the reticle base (reference numeral 20B of FIG. 3) on which the reticle stage 20A is arranged is omitted. Further, the aberration correction plate 38 is arranged between the reticle R and the projection optical system PL as explained later.

2. Correction of Imaging Characteristics

The apparatus of FIG. 4 is provided with a correction mechanism for correcting the imaging characteristics of the projection optical system PL. The correction mechanism is comprised of a first correction mechanism for correcting mainly imaging characteristics such as symmetric distortion and a second correction mechanism for correcting mainly imaging characteristics such as asymmetric distortion. First, the first correction mechanism will be explained. The imaging characteristics of the projection optical system PL include the focal position, curvature of the field, distortion, astigmatism, coma aberration, spherical aberration, projection magnification, and telecentricity. Various mechanisms may be considered for correcting these. Here, an explanation will be made of the correction mechanism for distortion. In this embodiment, the imaging characteristics of the projection optical system PL are found in advance by actual measurement or calculation and the imaging characteristics corrected based on the results.

In FIG. 4, the first correction mechanism is comprised of a drive mechanism 20C of the reticle R (reticle holder 20D) and a drive mechanism (not shown) of the lens element (topmost lens element) of the reticle side of the projection optical system PL. That is, the imaging characteristics are corrected by driving the reticle holder 20B holding the reticle R by suction or the topmost lens element in the projection optical system PL under the control of the main control system 27 by a not shown imaging characteristic control system.

First, an explanation will be given of the driving of the topmost lens element. In the projection optical system PL, the topmost lens element is fixed to a support member. The other lens elements after the topmost lens element are fixed to the barrel of the projection optical system PL. Note that in this embodiment, the optical axis AX of the projection optical system PL indicates the optical axis of the optical system comprised of the other lens elements. The support member of the topmost lens element is connected with the barrel of the projection optical system PL through drive elements comprised of a plurality of piezoelectric elements. In this case, operation of the drive elements enables movement of the topmost lens element parallel to the optical axis AX. Further, by providing three drive elements and operating them independently, the topmost lens element can be tilted with respect to the plane perpendicular to the optical axis AX. These operations enable correction of the imaging characteristics of the projection optical system PL, for example, projection magnification, distortion, curvature of the field, and astigmatism.

Here, when the topmost lens element moves in parallel in the direction of the optical axis AX, the projection magnification of the projection optical system PL (magnification from reticle to wafer) changes by a rate of change in accordance with the amount of movement. Further, when the topmost lens element is tilted from the plane perpendicular to the optical axis AX, one projection magnification with respect to the rotational axis increases, while the other projection magnification decreases, that is, deformation of a square image to a trapezoidal one can occur. Conversely, trapezoidal distortion can be corrected by tilting the topmost lens element.

Next, an explanation will be made of the reticle R. As explained above, it is possible to change the interval between the projection optical system PL and the reticle R by operation of the plurality of drive elements (for example, piezoelectric elements) at the bottom of the reticle holder 20D. Here, when the reticle R moves parallel to the optical axis AX, aberration called "pincushion (or barrel) distortion" can occur in the projection image. Note that as the drive elements for driving the topmost lens element of the projection optical system PL and the drive element 20C for driving the reticle R, it is also possible to use electrostrictive elements and magnetostrictive elements in addition to piezoelectric elements.

As explained above, by driving the reticle R or the topmost lens element of the projection optical system PL, it is possible to suitably correct the projection magnification or distortion of the projection optical system PL. Further, the focal position or tilt angle of the imaging plane changes due to driving these, but the amount is fed back as offset of a focal position detection system (not shown) and the focal position of the surface of the wafer W controlled to always match the average focal position of the imaging plane of the projection optical system PL.

Note that in addition to the first correction mechanism for correcting distortion of the projection image, a mechanism inserting a glass plate giving a partial slight curvature for correcting distortion in the space between the projection optical system and reticle, a mechanism inserting a glass plate of a variable thickness (for example, an optical prism etc.) in the space between the projection optical system PL and the reticle R, etc. may also be used. In particular, the method of inserting a glass plate with a variable thickness is almost the same as the method of moving the reticle R up and down and gives the same effect without having a detrimental effect on the rigidity of the reticle stage 20A. Further, various other methods such as the method of creating a sealed gas chamber between part of the lens of the projection optical system and changing the pressure or the composition of the air (mixture ratio) have also been proposed. These may also be similarly used.

The first correction mechanism may also be used when correcting for changes in the imaging characteristics accompanying changes in the atmospheric pressure, absorption of illumination light of the projection optical system PL, changes in the illumination conditions, etc. in addition correcting the imaging characteristics found by actual measurement or calculation. This will be explained in brief below. First, an explanation will be made of the correction for changes in the environment such as changes in the atmospheric pressure. The main control system 27 is supplied with information from environmental sensors such as an atmospheric pressure sensor or temperature sensor. The main control system 27 calculates the amount of change of the imaging characteristics using a coefficient found in advance by calculation, experiments, etc. or a table etc. based on this information. Further, it finds the amount of correction of the correction mechanisms such as the drive element 20C and sends the results to a not shown imaging characteristic control system as a control signal. Based on this control signal, the imaging characteristic control system drives the drive element 20C and the drive elements of the topmost lens element of the projection optical system PL to control the topmost lens element or reticle R. Further, for the absorption of the illumination light of the projection optical system PL, for example, the illumination amount monitor 32 on the wafer stage 24 is used to measure the amount of illumination light passing through the projection optical system PL before the actual exposure operation. The main control system 27 stores for example differential equations and other mathematical models etc. for calculating the amount of change of the imaging characteristics and monitors the amount of illumination light to calculate the amount of change of the imaging characteristics with each moment. Correction by the correction mechanism the same as in the case of the above environmental changes is possible based on the amount of change.

Next, a detailed explanation will be given of the configuration and operation of the second correction mechanism. The second correction mechanism corrects mainly for asymmetric (nonrotationally symmetric) distortion as explained above. It causes distortion of the projection image of the reticle R corresponding to the distortion on the wafer W to correct the imaging characteristics. First, the configuration will be explained. As shown in FIG. 4, a correction plate (aberration correction plate) 38 comprised of a transparent optical member is arranged parallel to the XY plane between the reticle R and the projection optical system PL (about in the middle). The correction plate 38 is provided to be able to be attached or detached manually or inserted and removed by an automatic exchanger (not shown). When providing an automatic exchanger, exchange with other similar correction plates stored in a storage place becomes possible according to need. The correction plate 38 is designed to correct the random distortion difficult to correct by the first correction mechanism by changing the shape of the projection image of the projection optical system PL. Further, the correction plate 38 can also be used for the purpose of producing distortion corresponding to the distortion characteristics of another projection exposure apparatus placed before or after that projection exposure apparatus. Note that the shape etc. of the correction plate 38 will be discussed later.

Figure 5A:
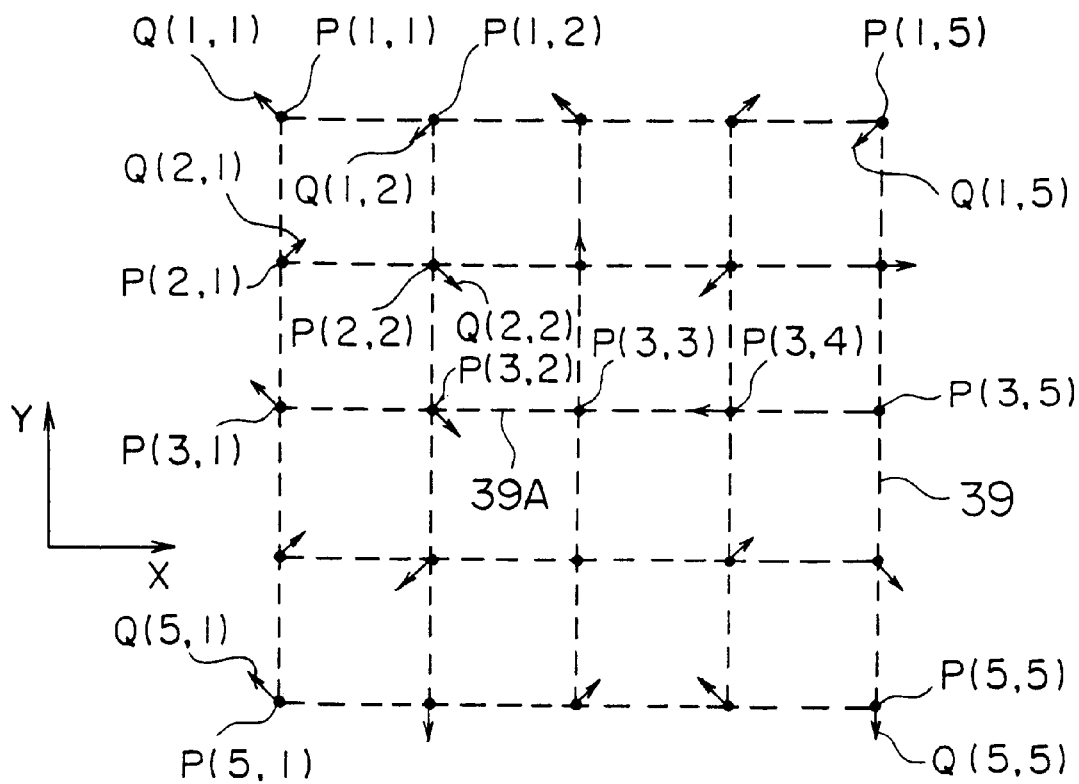
FIG. 5a is a view of an example of asymmetric residual distortion to be corrected by an aberration correction plate of the second embodiment of the present invention.
Figure 5B:
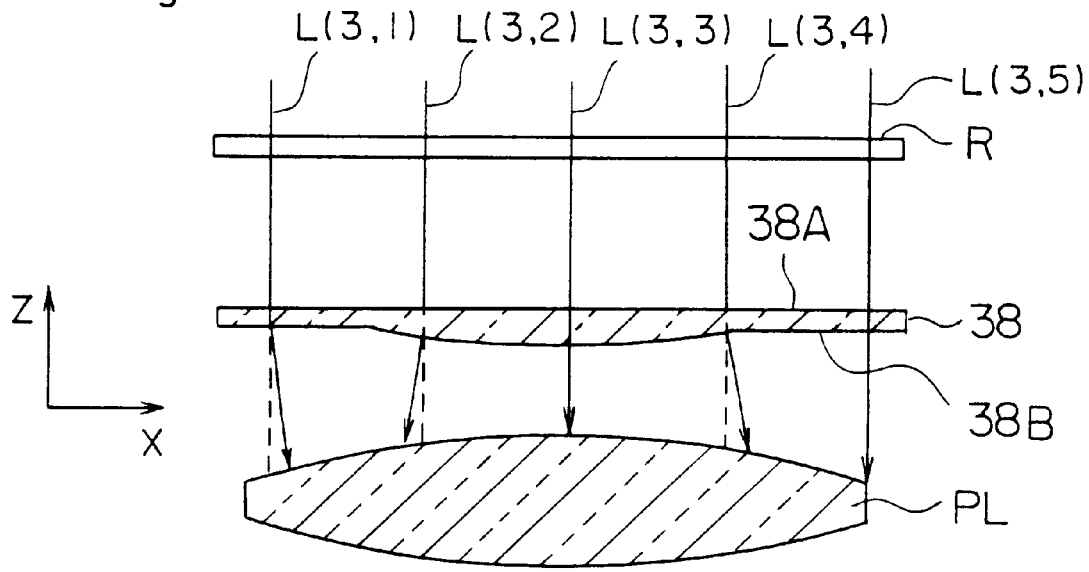
FIG. 5b is a sectional view of the shape and arrangement of the aberration correction plate of the second embodiment of the present invention.

Next, an explanation will be given of the operation of the second correction mechanism with reference to FIG. 5a and FIG. 5b. The distortion of the projection optical system PL is measured by test exposure or the method of use of a photoelectric sensor and is first corrected by the first correction mechanism. Distortion unable to be corrected remains, however. FIG. 5a shows an example of the residual distortion. In this case, the residual distortion is shown as an offset of the pattern on the reticle R. That is, the state of the residual distortion of the projection image on the wafer W converted to lateral offset of the pattern on the reticle R is shown in FIG. 5a.

In FIG. 5a, offset of the projection image occurs, as shown by the arrows, at the lattice points of the ideal lattice 39 (pattern corresponding to distortion-less lattice shaped projection image) shown by the dotted lines. In this case, the directions and sizes of the arrows show the direction and size of the offset of the projection image. As shown in FIG. 5a, there is no consistency in the directions and sizes of the arrows. They are randomly distributed. For example, the four points P(1,1), P(1,2), P(2,1), and P(2,2) adjoining each other at the top left are offset to the upper left point Q(1,1), lower left point Q(1,2), upper right point Q(2,1), and lower right point Q(2,2). The offsets of the adjoining positions are in different directions in this way. Further, the lattice points P(1,5), P(5,1), and P(5,5) of the other corner are also offset to the lower left point Q(1,5), upper left point Q(5,1), and lower right point Q(5,5). That is, the direction of the offset is random both in partial and overall regions. Further the size of the offset is random as well.

These nonsymmetric random distortion components could not be corrected more than this by the conventional methods. In this embodiment, however, the random distortion components are corrected using the correction plate 38. FIG. 5b is a sectional view of the state of arrangement of the correction plate 38 between the reticle R and the projection optical system PL (topmost lens element). As shown in FIG. 5b, the top surface 38A of the correction plate 38 is shaped to be substantially parallel to the reticle R. On the other hand, the bottom surface 38B is ground to give it a local angle so that the main light rays passing through the reticle R are bent in a direction canceling out the distortion. The sectional shape of the correction plate 38 in this case shows the example of the case of correction of distortion of the projection image on the line 39A connecting the center lattice point P(3,1) to lattice point P(3,5) in the ideal lattice 39 of FIG. 5a. Therefore, the main light ray L(3,1) of FIG. 5b passing through the lattice point P(3,1) is bent in a direction canceling out the offset to the upper left direction at the lattice point P(3,1), that is, in the lower right direction. Similarly, the main light rays L(3,2) to L(3,5) passing through the lattice point P(3,2) to lattice point P(3,5) are also bent in directions canceling out the distortions at the lattice point P(3,2) to lattice point P(3,5). Further, the overall shape of the correction plate 38 is ground to a shape corresponding to the distribution of distortion of FIG. 5a.

By grinding the correction plate 38 to a predetermined shape in this way, the corresponding distortion can be corrected. If trying to correct too much distortion by the correction plate 38, however, the thickness of the correction plate 38 will change considerably depending on the location and there will be a detrimental effect on the image plane or spherical aberration, so it is better to correct the symmetric components by the first correction mechanism as much as possible and correct only the remaining components by the correction plate 38. Note that the aberration correction plate of the present invention is not limited to the above correction plate 38. Other aberration (curvature of the field, astigmatism, spherical aberration, coma aberration, longitudinal aberration, and lateral aberration) and telecentricity may also be corrected. Further, the rotationally symmetric components of any aberration (including components remaining without being corrected at the time of assembly and adjustment of the projection optical system PL) may also be corrected. Further, the correction plate 38 of the present embodiment preferably is arranged between the reticle R and the projection optical system PL, but the position of arrangement of the correction plate (optical element) to which the present invention is applied is not limited to between the reticle R and the projection optical system PL. That is, it is sufficient to arrange the optical element at a predetermined position in the imaging light path between the reticle R and the photosensitive plate W in accordance with the aberration to be corrected. Further, the correction plate of the present invention may be shaped in any way.

A parallel flat plate arranged to be able to tilt between the projection optical system PL and the photosensitive plate W may also be used as the correction plate to correct for example eccentric coma aberration. Further, a glass plate having a predetermined curvature for correcting the curvature of the field (Petzval field) may also be used. Alternatively, a parallel flat plate for correcting spherical aberration may be used. Note that an optical element for correcting curvature of the field or spherical aberration is arranged between the projection optical system PL and the photosensitive plate W. Further, a plurality of optical elements with different curvatures or thicknesses may be interchangeably arranged in the imaging light path. Further, two prism-shaped optical elements arranged between the reticle R and the projection optical system PL may also be used as the above correction plate. In this case, at least one of the optical elements is made movable to adjust the thickness and correct distortion, in particular, rotationally symmetrical components.

3. Production of Reticle R and Aberration Correction Plate 38

Since the light source 1 in this embodiment is an $F_2$ laser light source (wavelength 157 nm), the reticle R and correction plate 38 are produced using the fluorine-doped synthetic silica glass or synthetic silica glass having an OH group concentration of not less than 1000 ppm shown below.

(1) Case of Production Using Fluorine-Doped Silica glass

Figure 6:
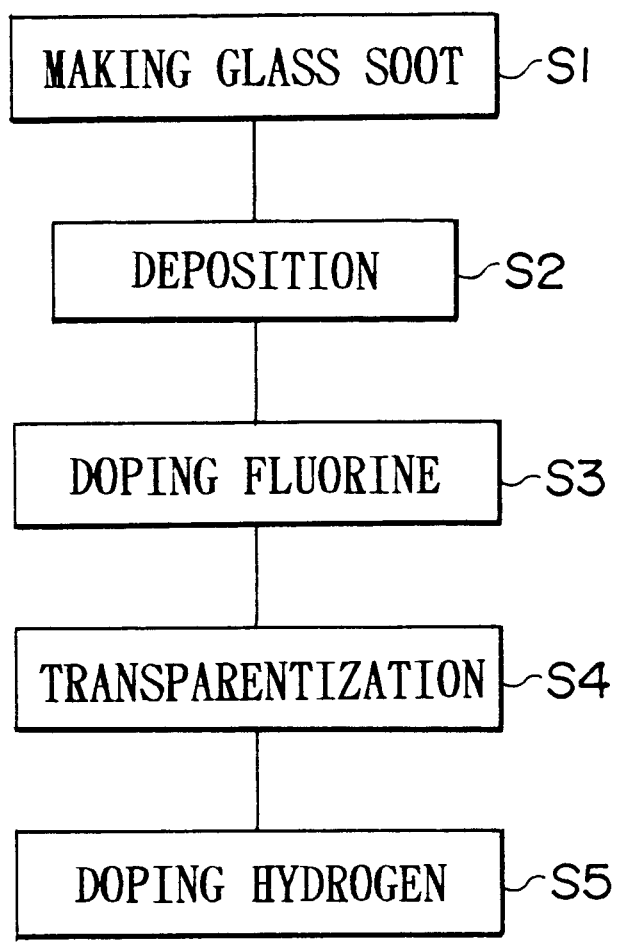
FIG. 6 is a flow chart of the production process of fluorine-doped silica glass of the second embodiment of the present invention.

An explanation will be given of the process of production of fluorine-doped synthetic silica glass with reference to the flow chart of FIG. 6. First, a silicon compound such as $SiCl_4$ is hydrolyzed in an oxyhydrogen flame to obtain glass particles (so-called "soot") (S1). Next, the glass particles are made to deposit to form porous glass (so-called "lump of soot") (S2). The method of forming the porous glass and the conditions for the same are not particularly limited. The VAD (vapor phase axial deposition) method, OVD (outside vapor deposition) method, sol-gel method, etc. may be suitably applied. Next, the porous glass is heat treated in a fluorine-containing atmosphere to obtain fluorine-doped porous glass (S3). As the fluorine-containing atmosphere, an inert gas atmosphere containing 0.1 to 100 vol % of a gas of a fluorine compound such as $SiF_4$ is preferable. Further, the pressure in the fluorine doping treatment is preferably 0.1 to 10 atm and the temperature 1000 to 1700° C. This is because outside of the above ranges, doping of a sufficient amount of fluorine tends to be difficult.

Next, the fluorine-doped porous glass is made transparent to obtain fluorine-doped synthetic silica glass (S4). The porous glass is normally made transparent at a temperature of more than the softening point (preferably melting point) of the glass in an He or other inert gas atmosphere, but here the porous glass is made transparent in a fluorine-containing atmosphere. This is because if making it transparent in a fluorine-containing atmosphere, the amount of the fluorine doped tends to increase and be maintained. As the fluorine containing atmosphere, an inert gas atmosphere containing 0.1 to 100 vol % of a gas of a fluorine compound such as $SiF_4$ is preferable. Further the pressure in the fluorine doping treatment is preferably 0.1 to 10 atm. Note that when making the porous glass transparent in a fluorine-containing atmosphere, the fluorine-doping step (S3) and the transparentization step (S4) may be performed in a single step.

Further, the fluorine-doped synthetic silica glass is heat treated in a hydrogen gas-containing atmosphere to obtain fluorine- and hydrogen-doped synthetic silica glass (S5). As the hydrogen gas-containing atmosphere, an inert gas atmosphere containing 0.1 to 100 vol % of hydrogen gas is preferable. Further the pressure in the hydrogen doping treatment is preferably 0.1 to 10 atm. This is because outside of this range, doping of a sufficient amount of hydrogen molecules tends to become difficult. Further, the temperature during the hydrogen doping (S5) is preferably less than 5000, more preferably 0 to 500° C., particularly preferably 300 to 500° C.

In this process of production, by first doping the porous glass (so-called "lump of soot") with fluorine, the incomplete structures (bonds) in the porous glass can be terminated by fluorine. In particular, with porous glass synthesized by the VAD method etc., the atmosphere easily becomes an oxygen-deficient atmosphere at the time of dehydrogenation or transparentization and Si—Si bonds having an absorption band at 163 nm are easily produced. According to this process of production, due to the presence of fluorine there, the Si—Si bonds can be cleaved and terminated by Si—F bonds, so the production of the above absorption band is canceled. Further, Si—F bonds have a larger bond energy than Si—H bonds or Si—Cl bonds and so can remain stable in structure even if exposed to the strong energy of ultraviolet rays.

Note that when using the photomask of the present invention in an exposure apparatus provided with a light source emitting illumination light of a wavelength not more than about 170 nm, the OH group concentration in the silica glass is preferably lowered by the above dehydrogenation etc. This is because by lowering the OH group concentration, it is possible to raise the transmittance of the silica glass with respect to light of a wavelength of about 155 nm to 170 nm. To raise the transmittance, the OH group concentration in the silica glass is preferably held to less than 100 ppm. More preferably, if held to less than 10 ppm or so, the transmittance with respect to light of a wavelength of 155 nm to 170 nm can be further improved. Here, when performing the treatment for removing OH groups to less than 1 ppm, reducing defect seeds, for example, the Si—Si bonds, may be produced, but in the present invention the silica glass is doped with fluorine and the fluorine acts to suppress the production of such defects.

Next, the porous glass is made transparent, then is heat treated in a hydrogen gas atmosphere in a temperature region of preferably not more than 500° C. Doping of hydrogen is possible thermodynamically in a temperature region from ordinary temperature to 2500 K (2227° C.). By doping hydrogen at a relatively low temperature as not more than 500° C., hydrogen can be doped in the state of hydrogen molecules without breaking of bonds by exposure to ultraviolet rays and creation of Si—H bonds easily becoming E'centers and without causing a reduction of the Si—F bonds. Therefore, in addition to the above strong structure, the E'centers produced by exposure to ultraviolet rays are terminated by the doped hydrogen atoms and a stronger UV resistance can be obtained. Note that if performing the heat treatment in a hydrogen atmosphere at a temperature of over 500° C., Si—H bonds are produced, so the UV resistance tends to end up falling. It is not preferable to further raise the heat treatment temperature. Of course, the lower the heat treatment temperature, the lower the production efficiency, so 300 to 500° C. is particularly preferable.

The concentration of fluorine in the synthetic silica glass produced in this way is preferably more than 100 ppm, more preferably 100 to 30,000 ppm, particularly preferably 500 to 30,000 ppm. Further, the concentration of hydrogen molecules in the synthetic silica glass is preferably more than $1 \times 10^{17}$ molecules/cm$^3$, particularly preferably $1 \times 10^{17}$ to $1 \times 10^{10}$ molecules/cm$^3$.

Note that in the above process of production, hydrogen was doped in addition to fluorine, but doping of hydrogen is not necessarily required. Synthetic silica glass doped with only fluorine may also be used to produce the reticle R or correction plate 38. The process of production of synthetic silica glass in this case can be easily realized by eliminating from the process of production of the above fluorine- and hydrogen-doped synthetic silica glass the step of doping hydrogen (S5 in FIG. 6), so the explanation will be omitted here.

The reticle R and correction plate 38 in the present embodiment are produced using the fluorine-doped synthetic silica glass produced by the above process. The fluorine-doped synthetic silica glass has the incomplete structures (bonds) in the silica terminated by fluorine, becomes more complete in structure, has less absorption of ultraviolet rays and stably maintains its structure even if exposed to the strong energy of ultraviolet rays. Therefore, the reticle R and correction plate 38 produced in this way are high in light transmittance and have little color center, compaction, and other deterioration along with time due to exposure to ultraviolet rays even when using an $F_2$ laser having a wavelength 157 nm as the illumination light. Further, since synthetic silica glass is used, there is resistance to heating and cooling, the work efficiency at the time of production, including pattern formation, is good, and the coefficient of linear expansion is extremely small, so a high precision can be realized at the time of production and exposure. Further, by doping hydrogen in addition to fluorine, it is possible to strikingly improve the UV resistance by the synergistic effect of the properties of fluorine and hydrogen molecules with respect to UV resistance.

Note that current photomasks are generally of a thickness of about 6 mm and a size of about 150 mm square, but the above VAD method, OVD method, sol-gel method, and other production processes are suited to the production of cylindrical silica glass. They are not suited to the production of sheet glass of a large area. Therefore, when producing the silica glass sheet, the method may be employed of first producing a cylindrical glass rod by the above processes, then heat pressing the cylindrical glass rod to shape it to a substantially flat sheet, then cutting and grinding it to finish it to a desired size. At the time of this pressing, it is also possible to further perform treatment in a hydrogen atmosphere at less than 500° C. after the above heat treatment. This heat treatment causes hydrogen molecules to dissolve into the silica glass and thereby improves the light resistance. The temperature at the time of this hydrogen treatment is preferably less than 500° C. to suppress generation of reducing defect seeds by reaction with hydrogen. This method enables formation of a 150 mm square reticle substrate from a small diameter cylindrical silica glass and enables production of the photomask of the present invention by a smaller size, that is, lower cost, production facility. Of course, this process of production may be applied for an aberration correction plate as well.

(2) Case of Production using Silica glass Having OH Group Concentration Not Less Than 1000 ppm The synthetic silica glass able to be used for the production of a reticle R and correction plate 38 in this case is synthetic silica glass having a structure determining temperature of not more than 1200 K and an OH group concentration of not less than 1000 ppm, preferably 1000 to 1300 ppm. By making the OH group concentration not less than 1000 ppm and the structure determining temperature not more than 1200 K in this way, it is possible to make the scattering loss and absorption loss much lower when using it for vacuum ultraviolet rays of a wavelength not more than about 200 nm and possible to reduce the deterioration over time, so use of this synthetic silica glass to produce the reticle R or correction plate 38 enables production of a reticle R or correction plate 38 with a high transmittance and a superior UV resistance.

The total amount of the light scattered and absorbed in the reticle R or correction plate 38, that is, the amount of transmission loss, has an effect on the amount of light on the wafer W and has an effect on the reduction of the throughput due to the reduction of the illumination, so the scattering of light or absorption of light must be reduced. Here, the "absorption of light" means the phenomenon derived from the movement of electrons due to the energy of the photons striking the optical members. If light absorption occurs in an optical member, the energy is mainly converted into heat energy, the optical member swells, the refractive index or surface state changes, and as a result a high resolution can no longer be obtained. Further, in the process of easing of the light absorption along with changes in the state of electrons, light of a wavelength longer than the incident light is emitted as fluorescence. This fluorescence is close in wavelength to the exposure wavelength and if increased in intensity significantly reduces the contrast of the image.

Further, in general, the energy of the light striking a substance causes the phenomenon of scattering. The scattering phenomenon may be roughly classified into Rayleigh scattering, Brillouin scattering, and other elastic scattering and Raman scattering and other nonelastic scattering. In particular, if the scattering intensity of the reticle R or correction plate 38 is high, the scattered light becomes a cause of reduction of the contrast of the image and reduction of the optical characteristics. Of course, the light scattering has a smaller effect compared with changes in the shape or refractive index of an optical member due to light absorption, but the light scattering cannot be ignored in the vacuum ultraviolet ray spectrum of an $F_2$ laser (wavelength 157 Here, the mechanism by which the transmission loss with respect to vacuum ultraviolet rays is significantly suppressed in silica glass having a structure determining temperature, a parameter of structural stability, of not more than 1200 K, that is, silica glass having close to an ideal structure into which not less than 1000 ppm of OH groups are introduced, is not necessarily clear, but the following may be considered. Note that the structure determining temperature of silica glass of the present invention is extremely low compared with for example the 1450 K structure determining temperature of an optical fiber. Silica glass with a high structure determining temperature is believed to be structurally unstable. That is, the ≡Si—O—Si≡ bond angles in the silica glass network have a certain distribution due to the glass. This distribution of bond angles includes structurally unstable ones. This distribution of bond angles is believed to be due to the bridging of tetrahedrons produced by the oxygen atoms and silicon atoms in the silica glass and therefore the presence of tetrahedrons of distorted forms. These distorted bond portions are easily cleaved by exposure to ultraviolet rays and end up producing harmful E'centers, NBOHC, or other defects. As opposed to this, in silica glass with a low structure determining temperature, there are believed to be extremely few such distorted bond portions.

Further, the silica glass containing OH groups in the above range is structurally stabler compared with other silica glass and tends to have a lower structure determining temperature. The detailed reasons are as follows: As explained above, the ≡Si—O—Si≡ bond angles in the silica glass network have a certain distribution due to the glass and include structurally unstable bond portions. If there are OH groups in the above range, however, there is no longer a need for bridging giving rise to unstable bond angles, so the tetrahedrons can be brought close to the stablest structures. Therefore, silica glass containing OH groups in this range are structurally stabler compared with other silica glass and tend to have lower structure determining temperatures. Accordingly, in synthetic silica glass having a concentration of OH groups of not less than 1000 ppm and a structure determining temperature of not more than 1200 K, the synergistic effect enables a reduction of the scattering loss and absorption loss with respect to vacuum ultraviolet rays. In such a silica glass, the concentration of fluorine is preferably at least 300 ppm. This is because if the fluorine concentration is more than 300 ppm, the structure determining temperature tends to become lower under the same annealing conditions.

Further, some of the reasons for the deterioration of the UV resistance of silica glass are known to be the ≡Si—Si≡, ≡Si—O—O—Si≡, solute oxygen molecules, etc. These precursors end up being easily converted to E'centers, NBOHC, and other structural defects due to exposure to ultraviolet rays such as of excimer lasers and become causes for the reduction of the transmittance. In the silica glass of this embodiment, however, due to the few incomplete structures derived from this deviation from the stoichiometric ratio, the UV resistance is also excellent, so the reticle R or correction plate 38 in this embodiment has little deterioration along with time and can exhibit a predetermined performance over a long period.

Note that in this silica glass, the chlorine concentration is preferably less than 50 ppm, particularly preferably less than 10 ppm. This is because if the chlorine concentration is over 50 ppm, maintaining the OH group concentration in the silica glass at not less than 1000 ppm tends to become difficult. Further, high purity silica glass with concentrations of the metal impurities contained (Mg, Ca, Ti, Cr, Fe, Ni, Cu, Zn, Co, Mn, Na, K) of all not more than 50 ppb, particularly preferably not more than 20 ppb, is preferably used. Due to this, the structural defects are reduced and the structure becomes close to ideal. Further, the change in refractive index, surface changes, and deterioration in transmittance due to metal impurities become smaller and the UV resistance tends to become improved.

In the present embodiment, fluorine-doped silica glass or silica glass with an OH group concentration of not less than 1000 ppm was used for both of the reticle R and the aberration correction plate 38, but it is also possible to make the reticle R by any of the fluorite ($CaF_2$) explained in the first embodiment, the thin sheet of silica glass explained in the later explained third embodiment, and the rock crystal and magnesium fluoride explained in the later explained fourth embodiment and make just the aberration correction plate 38 by the silica glass according to the present embodiment. Note that the reticle R using the silica glass according to the present embodiment may similarly be formed with the protective films (42A to 42D) explained in the above first embodiment (FIG. 1).

Third Embodiment

Next, an explanation will be given of a third embodiment of the present invention with reference to the drawings. The projection exposure apparatus of the third embodiment is substantially the same in overall configuration as the projection exposure apparatus of the first or second embodiment (FIG. 3 or FIG. 4). In this embodiment, the structure of the reticle R and the holding structure for the same are specially designed. Therefore, details of the projection exposure apparatus will be omitted.

Figure 7A:
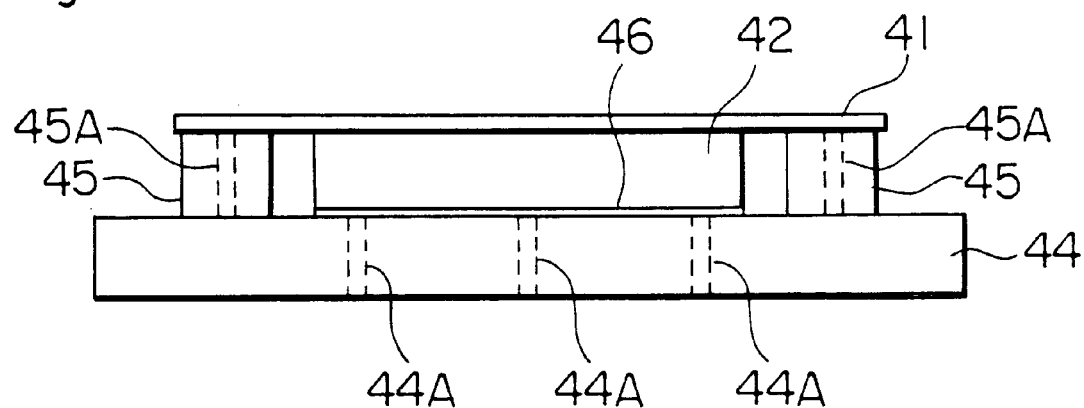
FIG. 7a is a front view of a reticle of a third embodiment of the present invention.
Figure 7B:
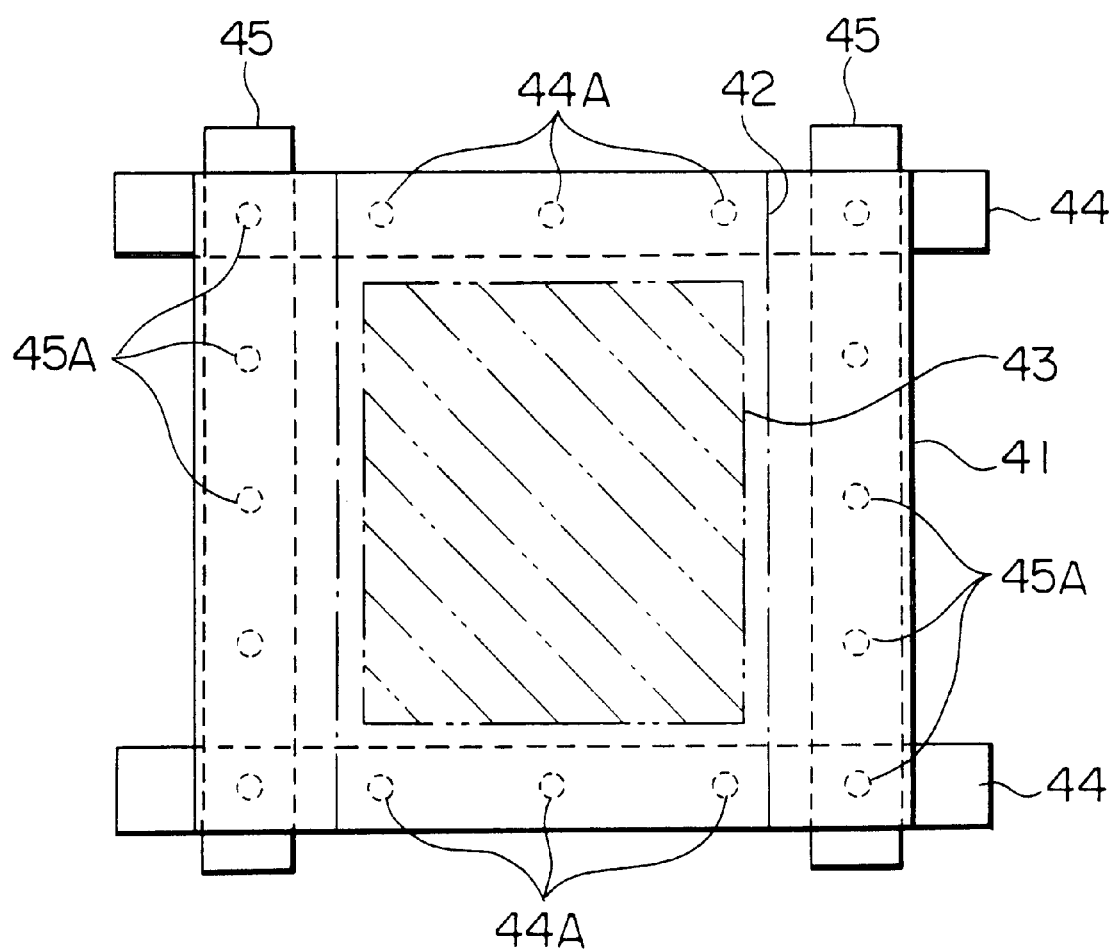
FIG. 7b is a plan view of the reticle of the third embodiment of the present invention.

FIG. 7a and FIG. 7b are views of the configurations of the reticle R and reticle holder 20D of the third embodiment. FIG. 7a is a front view and FIG. 7b is a plane view. In FIG. 7a and FIG. 7b, the reticle R serving as the photomask is provided with a glass substrate 41 comprised of a thin sheet of synthetic silica glass and a reinforcing substrate (reinforcing member) 42 comprised of a sheet of fluorite ($CaF_2$). The pattern to be transferred and the reticle alignment marks etc. are formed on the glass substrate 41. The thickness of the glass substrate 41 is for example 0.5 to 1.0 mm. The thickness of the reinforcing substrate 42 in this case may be set to for example about 2 to 3 mm. Note that in FIG. 7b, reference numeral 43 shows a pattern formation region of the glass substrate 41 (region through which illumination light can pass).

The reticle 20D is provided with first holders 44, 44 and second holders 45, 45. The first holders 44 hold the reinforcing substrate 42 by suction. The first holders 44 are formed with a plurality of through holes 44A for suction and are fitted with thin film-like elastic sheets 46 comprised of rubber etc. at the portions where the reinforcing substrate 42 is to be held. The second holders 45 are arranged to be substantially perpendicular to the first holders 44. The second holders 45 are formed with a plurality of through holes 45A for suction. The glass substrate 41 is held by suction by the second holders 45 near the two sides. The first holders 44 and second holders 45 are supported and fixed independently from each other on the reticle stage 20A. The top surface of the reinforcing substrate 42 is in register with the plane of the top surface of the second holders 45 in the state held by suction on the first holders 44 or sticks out from it very slightly. In the state with the glass substrate 41 held by suction by the second holders 45 with its pattern forming surface facing down, the top surface of the reinforcing substrate 42 comes into uniform, close contact with the bottom surface of the glass substrate 41, whereby flexing and other deformation due to the weight of the thin sheet of the glass substrate 41 is prevented.

In the reticle R of this embodiment, a pattern is formed on the thin sheet of the glass substrate 41, and the glass substrate 41 is held by the reinforcing substrate 42, comprised of fluorite having superior characteristics with respect to ultraviolet rays, in particular vacuum ultraviolet rays, to prevent flexing etc. The glass substrate 41 is comprised of synthetic silica glass, so has little deterioration due to heating and cooling, is high in hardness, and scratch resistant, so is good in work efficiency in the processing such as pattern formation and, further, has a small coefficient of linear expansion, so can form a pattern with a good precision. This glass substrate 41 is thin, so the transmission loss of the illumination light is small and practical use is possible even when using ultraviolet rays as the illumination light. Here, the glass substrate 41 is made a thin sheet to make the transmission loss small, so there is a concern over the reduction in precision at the time of exposure due to deformation by flexing etc., but the relatively thick reinforcing substrate 42 made of fluorite is used to uniformly hold at least the pattern formation region (region through which illumination light passes) of the glass substrate 41, so deformation of that portion can be prevented and high precision exposure realized.

Note that the glass substrate 41 may be an ordinary synthetic silica glass as well, but may be made using the fluorine-doped synthetic silica glass, fluorine- and hydrogen-doped synthetic silica glass, or synthetic silica glass containing not less than 1000 ppm of OH groups explained in the first embodiment. By doing this, the UV resistance and the transmittance can be improved. Synthetic silica glass doped with aluminum or another light metal may be used as well. The above elastic sheet 46 is not necessarily required when the reinforcing member 42, the holders 44, 45, and other parts are processed to strict dimensions and the top surface of the reinforcing substrate 43 and top surface of the second holders 45 can be set to the same plane. Alternatively, instead of this, it is possible to use another means for absorbing the dimensional error of the parts.

Further, instead of using fluorite as the reinforcing substrate 42, it is also possible to use for example rock crystal or magnesium fluoride.

In the above third embodiment, the glass substrate 41 and the reinforcing substrate 42 were designed to be held by suction by the first and second holders 44 and 45 independently, but it is also possible to join the two by a holding member holding them in the state in close contact with each other and hold this by suction by the reticle holder 20D. By doing this, it is possible to prevent the entry of dust, foreign matter, etc. between the glass substrate 41 and reinforcing substrate 42, help protect the pattern formation surface of the glass substrate 41 as well, and make the reinforcing substrate 42 function as a pellicle. The reinforcing substrate 42 need only be able to hold the portion of the glass substrate 41 of the region 43 where the illumination light passes, so just the portion corresponding to that region may be made by fluorite and this held by the holding member.

Figure 8A:
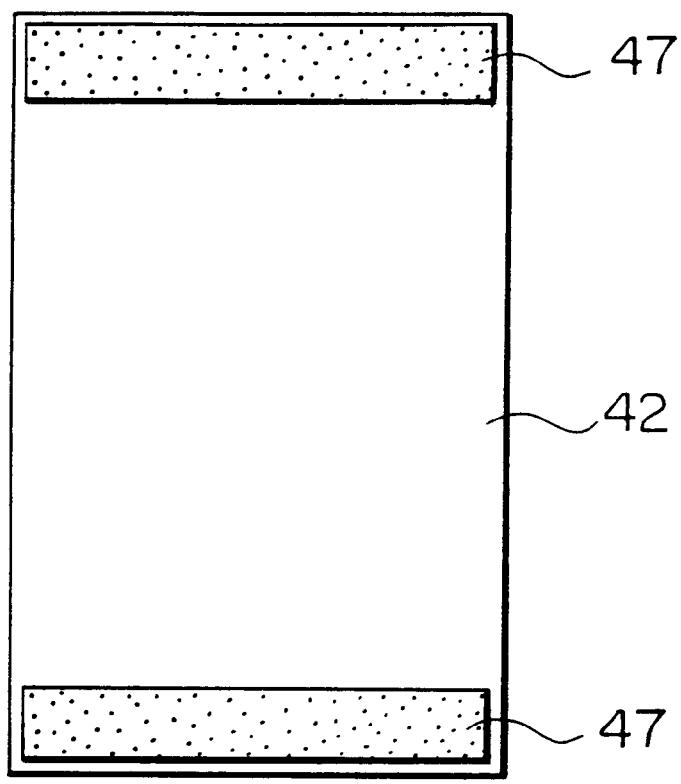
FIG. 8a is a bottom view of a reinforcing substrate of the third embodiment of the present invention.
Figure 8B:
FIG. 8b is a side view of the reinforcing substrate of the third embodiment of the present invention.

Fluorite, however, is fragile and easily scratchable by nature, so the reinforcing substrate 42 is liable to be scratched during transport etc. of the reticle R including the reinforcing substrate 42 or foreign matter produced due to damage or scratching is liable to have a detrimental effect on the exposure operation. To deal with this, the following protective films may be formed on the reinforcing substrate 42. FIG. 8a and FIG. 8b show a reinforcing substrate in this case. FIG. 8a is a bottom view, while FIG. 8b is a side view. The portions of the bottom of the reinforcing substrate 42 (surface opposite to surface where glass substrate is contacted) which are held by suction by the first holders 44 are formed with protective films 47. As the protective films 47, for example diamond grown by the CVD (chemical vapor deposition) process may be used. Further, silicon oxide (SiO or $SiO_2$), chrome (Cr), chromium oxide (CrO), molybdenum silicide ($MoSi_2$), etc. may also be used. As the method of formation, they may be formed by a photolithographic process in the same way as ordinary pattern formation.

Since the portions of the reinforcing substrate 42 held by suction by the first holders 44 are formed with protective films 47, even if formed by a soft material such as fluorite, there will be no damage or scratches etc. at the time of contact with the first holders 44 etc., less defects will occur in the reinforcing substrate 42 itself, and less foreign matter will be produced, so the problem of foreign matter depositing on the pattern surface of the glass substrate 41 and causing deterioration of the exposure precision can be prevented.

Note that the locations where the protective films 47 are formed on the reinforcing substrate 42 are not limited to the positions shown in FIG. 8a and FIG. 8b. It is also possible to form them on the side portions or all portions coming into contact with other members. Further, when joining the reinforcing substrate 42 and glass substrate 41, the protective films 47 should be formed at portions held by the holding member used for that purpose. Further, the protective films 47 may be formed not only at the reinforcing substrate 42, but also the portion of the glass substrate 41 held by suction by the second holders 45 or other portions. In this case, if simultaneously forming the films with the formation of the pattern of the glass substrate 41, the film-formation process may be simplified and the cost of manufacture reduced. Note that it is possible to have the reinforcing substrate 42 constantly held by the reticle holder 20D (first holders 44) and exchange only the glass substrate 41. Further, the first holders 44 need not be used at all. At that time, the reinforcing substrate 42 may be directly fixed to the reticle holder 20A.

In an exposure apparatus using an ArF excimer laser (193 nm) as explained above, a reticle comprised of synthetic silica glass may also be used, but considering the transmittance etc., a reticle or aberration correction plate explained in the first and second embodiments is preferably used. In particular, in an exposure apparatus using illumination light having a wavelength not more than 190 nm or so, specifically having an oscillation spectrum at 150 to 190 nm, use of ordinary synthetic silica glass is not realistic, so the photomask or aberration correction plate of the present invention is used.

Further, in the first and second embodiments, the explanation was made of application of silica glass according to the present invention for the reticle or the aberration correction plate, but it is also possible to apply it to an optical filter arranged at the pupil plane of the projection optical system PL (Fourier transform plane) or near the same and causing partially different optical characteristics of the imaging light (amplitude transmittance, interferability, etc.), i.e., a so-called pupil filter. For example, when transferring a contact hole pattern or other independent pattern to a photosensitive substrate W, a center light shielding type pupil filter for shielding the imaging light distributed at a circular region centered about the optical axis of the projection optical system PL and passing imaging light distributed at the outside of that circular region is used. Therefore, the silica glass of the first or second embodiment may be formed with a circular light shielding portion by chrome or another light shielding material and used as the above center light shielding type pupil filter.

In the above second and third embodiments, the explanation was given using as an example a so-called step-and-scan type exposure apparatus, but the present invention is not limited to this type of exposure apparatus and may also be applied to a so-called step-and-repeat type exposure apparatus and other types of exposure apparatuses as well.

Fourth Embodiment

An explanation will be given of a fourth embodiment of the present invention. The projection exposure apparatus of the fourth embodiment is substantially the same in overall configuration as the projection exposure apparatus of the above second embodiment and differs in the point that the reticle R is produced using the following rock crystal (crystallized quartz).

The process of production is as follows: First, an explanation will be given of the method of production (growth) of synthetic rock crystal transparent (with little transmission loss due to absorption etc.) with respect to ultraviolet rays up to a wavelength of about 146 nm. In this embodiment, it is grown by the hydro-thermal method using an autoclave. The growth conditions are set as follows: The temperature of the bottom tank (material tank) of the autoclave in which nutrient (rock crystal particles) are placed was set to 352° C., the temperature difference (·t) of the top tank (growth tank) of the autoclave with respect to the bottom tank was set to −44° C., the filling rate was set to 82%, the pressure was set to 1570 atm, the solution was made a 1M (molar concentration) sodium hydroxide (NaOH) aqueous solution, the concentration of lithium (Li+) salt added to the solution, when added, was made 0.1M, the basal plane of the seed rock crystal was made the (0001) face, and the speed of growth was made 1.78 mm/day.

Here, the higher the concentrations of Fe and OH in the synthetic rock crystal, the greater the absorption of ultraviolet rays (that is, the further the shift of the wavelength of the usable ultraviolet rays to the long side), so to lower them, in the present embodiment, $LiNO_2$ is added for example as an Li+ salt to the NaOH solution. Further, if the autoclave and nutrient basket, baffle (convection control plate), seed rock crystal holder, and other members and parts coming into contact with the solution are made by an alloy steel, the concentration of Fe in the solution becomes higher and the concentration of Fe in the synthetic rock crystal becomes higher, so in the present embodiment, these are silver plated. Note that it is also possible to use members and parts with silver linings or made of silver itself. Further, the plating material etc. may be a nonferrous metal other than silver which does not dissolve in a sodium hydroxide solution.

If the synthetic rock crystal is grown under these conditions, then a light transmittance close to that of a natural rock crystal or substantially equal to or better than it can be realized. Note that experiments have shown that the OH content of natural rock crystal is 4 ppm and the wavelength it is able to be used at is up to 152 nm, while the synthetic rock crystal grown by the method of the present embodiment, while differing somewhat depending on the conditions, in the best case can realize an OH content of the same 4 ppm and an applicable wavelength of down to 146 nm. It can be sufficiently used for an $F_2$ laser light. Note that the process of production of the above rock crystal is disclosed in for example A. A. Ballman, D. M. Dodd, N. A. Kuebler, R. A. Laudise, D. L. Wood, and D. W. Rudd, "Applied Optics, Vol. 7, No. 7 (July, 1968)", p. 1387 to p. 1390.

Further, in the case of a rock crystal plate kept down in Fe content by the above production process, it is possible to eliminate entry of particles of foreign matter (inclusions). Inclusions are nontransparent particles of a diameter of several dozen microns formed by Fe compounds. If these inclusions are present close to the pattern surface, they will be transferred as they are and give rise to defects in the circuit. The positions of inclusions can be identified and measured, but this takes time and results in poor efficiency. In the end, total elimination of inclusions in the reticle is preferred. By reducing the Fe content by the above production process, entry of inclusions can be eliminated.

The thus grown synthetic rock crystal is suitably cut and ground to make a rock crystal sheet of a predetermined size. Next, photolithography is used to form the pattern to be transferred by chrome etc., whereby the reticle R is produced.

Here, the surface on which the pattern is formed is preferably set to be the surface orthogonal to the optical axis of the rock crystal (Z-axis or c-axis). This is because, here, the coefficient of linear expansion of the rock crystal is $1.337 \times 10^{-5}$/K in the direction orthogonal to the optical axis (X-axis or a-axis, Y-axis or b-axis) and $0.797 \times 10^{-5}$/K in the direction of the optical axis, so it is advantageous to form the pattern in the plane including the X-axis and Y-axis having equal linear coefficients of expansion. Further, rock crystal is a monoaxial crystal and has birefringence. The pattern surface of the reticle is the surface downstream in the direction of incidence of the illumination light, so the effect is small, but not completely zero. The purpose of the above is also to eliminate the effect of this birefringence.

The amount of transmission loss due to absorption of light by the reticle R has an effect on the amount light on the wafer W and has an effect on the reduction of the throughput due to the reduction of the illumination, so the absorption of light must be reduced. Here, the "absorption of light" means the phenomenon derived from the movement of electrons due to the energy of the photons striking the optical members. If light absorption occurs in an optical member, the energy is mainly converted into heat energy, the optical member swells, the refractive index or surface state changes, and as a result a high resolution can no longer be obtained. Further, in the process of easing of the light absorption along with changes in the state of electrons, light of a wavelength longer than the incident light is emitted as fluorescence. This fluorescence is close in wavelength to the exposure wavelength and if increased in intensity significantly reduces the contrast of the image.

The reticle R of the present embodiment, however, is produced using the synthetic rock crystal grown by the above method, so does not absorb much of ultraviolet rays of a wavelength of up to about 146 nm and can maintain its structure stably even if exposed to the strong energy of ultraviolet rays. Therefore, even when using light of an $F_2$ laser of a wavelength of 157 nm as the illumination light, the light transmittance is high and there is little deterioration along with time due to exposure to ultraviolet rays. Further, the coefficient of linear expansion of rock crystal is as explained above and is small compared with the $2.4 \times 10^{-5}$/K coefficient of linear expansion of fluorite, so there is little deformation due to heating at the time of production of the reticle and there is resistance to heating and cooling as well, so the work efficiency at the time of production, including reticle pattern formation, is good.

In an exposure apparatus using an ArF excimer laser (193 nm), it is also possible to use a reticle made of ordinary silica glass, but considering the transmittance etc., it is preferable to use a reticle explained in the above embodiment. Further, not limited to an $F_2$ laser, in an exposure apparatus using illumination light having a wavelength not more than about 190 nm, specifically, an oscillation spectrum of 150 to 190 nm, it is not practical to use an ordinary silica glass, so a rock crystal photomask like in the fourth embodiment should be used. Further, leaving aside economical considerations, the invention may of course be applied to an exposure apparatus using illumination light of a wavelength of more than about 200 nm.

Further, instead of using an $F_2$ laser or ArF excimer laser, it is possible to amplify the infrared region or visible region single wavelength laser light emitted from a DFB semiconductor laser or fiber laser by erbium- (or erbium- and yttrium-) doped fiber amplifiers, and then use the high harmonic obtained by using non-linear optical crystals to convert the wavelength to ultraviolet light.

For example, if the oscillation wavelength of the single wavelength laser is made a range of 1.51 to 1.59 μm, the eighth harmonic having an oscillation wavelength of 189 to 199 nm or the 10th harmonic having an oscillation wavelength of 151 to 159 nm is output. In particular, if the oscillation wavelength is made a range of 1.544 to 1.553 μm, the eighth harmonic of a range of 193 to 194 nm, that is, ultraviolet light of substantially the same wavelength as an ArF excimer laser, is obtained, while if the oscillation wavelength is made a range of 1.57 to 1.58 μm, the 10th harmonic of a range of 157 to 158 nm, that is, ultraviolet light of substantially the same wavelength as an $F_2$ laser, is obtained.

Further, if the oscillation wavelength is made a range of 1.03 to 1.12 μm, the seventh harmonic having an oscillation wavelength of 147 to 160 nm is output. In particular, if the oscillation wavelength is made a range of 1.099 to 1.106 μm, the seventh harmonic of an oscillation wavelength of a range of 157 to 158 nm, that is, ultraviolet light of substantially the same wavelength as an $F_2$ laser, is obtained. Note that the single wavelength oscillation laser used is a yttrium-doped fiber laser.

Note that a semiconductor device is produced by the step of designing the functions and performance of the device, the step of fabricating a reticle explained in the above embodiment based on the design step, a step of fabricating a silicon wafer, a step of using the exposure apparatus explained in the above embodiment to transfer the pattern of the reticle to the wafer, a step of assembling the device (including a dicing step and packaging step), and an inspection step. Note that the present invention is not limited to the above embodiments and of course may be modified in various ways within the scope of the invention.

All of the contents of the disclosures of Japanese Patent Application No. 9-308342 filed on Nov. 11, 1997, Japanese Patent Application No. 10-52830 filed on Feb. 18, 1998, Japanese Patent Application No. 10-146604 filed on May 12, 1998, Japanese Patent Application No. 10-144303 filed on May 26, 1998, and Japanese Patent Application No. 10-300525 filed on Oct. 22, 1998, including the specifications, claims, drawings, and abstracts, are incorporated here by reference as they are.

What is claimed is:

1. A photomask comprising:

a substrate, a transfer pattern formed on the substrate, and a protective film formed at a contact region where the protective film is in direct contact with a mask supporting member when the photomask is held by the mask supporting member, for protecting the substrate, and wherein said photomask is held by vacuum suction on the mask supporting member and said protective film is formed at an area which is held by vacuum suction.

2. A photomask as set forth in claim 1, wherein the substrate is comprised of calcium fluoride.

3. A photomask as set forth in claim 1, which is irradiated by illumination light of a wavelength of not more than 190 nm.

4. A photomask as set forth in claim 3, wherein the substrate is comprised of calcium fluoride.

5. A photomask as set forth in claim 1, wherein the protective film is comprised of chrome, chromium oxide, or silicon oxide.

6. A photomask as set forth in claim 1, wherein the protective film is formed by the same material as the pattern.

7. A photomask as set forth in claim 1, wherein the protective film is provided at a surface of said substrate for formation of the pattern.

8. A photomask as set forth in claim 1, wherein said protective film is provided at an end face of the substrate.

9. A photomask, used for an exposure apparatus having a light source emitting illumination light of a wavelength of about 155 nm to 170 nm, comprising:

a substrate comprised of fluorine-doped silica glass and a pattern formed on that substrate.

10. A photomask as set forth in claim 9, wherein said silica glass is produced by hydrolyzing a silicon compound in a flame to produce glass particles, causing the glass particles to deposit to form porous glass, heat treating the porous glass in a fluorine-containing atmosphere to dope it with fluorine, then making the fluorine-doped porous glass transparent.

11. A photomask as set forth in claim 9, wherein an OH group concentration in the silica glass is not more than 100 ppm.

12. A photomask as set forth in claim 9, wherein the silica glass is further doped with hydrogen.

13. A photomask, used for an exposure apparatus provided with a light source emitting illumination light of a wavelength not more than about 200 nm, comprising:

a substrate produced using silica glass having a structure determining temperature of not more than 1200 K and an OH group concentration of not less than 1000 ppm and a pattern formed on the substrate.

14. A photomask, used for an exposure apparatus having a light source emitting illumination light of a wavelength not more than about 200 nm, comprising:

a substrate comprised of a thin sheet of quartz glass, a pattern formed on the substrate, and a reinforcing member, in direct contact with the substrate at a pattern area where the pattern is formed, comprised of a material having a transmittance equal to or more than the substrate at an area where the illumination light passes.

15. A photomask as set forth in claim 14, wherein the reinforcing member is in contact with the surface on which the pattern is formed of the substrate.

16. A photomask as set forth in claim 14, wherein the silica glass is doped with fluorine.

17. A photomask as set forth in claim 14, wherein the material is any of fluorine-doped silica glass, silica glass with an OH group concentration of not less than 1000 ppm, calcium fluoride, rock crystal, and magnesium fluoride.

18. A photomask used for a step-and-scan type projection exposure apparatus, comprising:

a substrate, a pattern for transfer formed on the substrate, and a protective film, formed at a contact region where the protective film is in direct contact with a mask supporting member when the photomask is held by the mask supporting member and extending in the scanning direction, for protecting the substrate, and wherein said photomask is held by vacuum suction on the mask supporting member and said protective film is formed at an area which is held by vacuum suction.

19. A photomask as set forth in claim 9, wherein a fluorine concentration in the silica glass is not less than 100 ppm.

20. A photomask as set forth in claim 13, wherein a fluorine concentration in the silica glass is not less than 300 ppm.

21. A photomask, used for an exposure apparatus provided with a light source emitting illumination light of a wavelength not more than about 200 nm, comprising:

a substrate made of silica glass having a structure determining temperature of not more than 1200 K and an OH group concentration of not less than 1000 ppm and a pattern formed on the substrate, wherein a chlorine concentration in the silica glass is not more than 50 ppm.

22. A photomask used for an exposure apparatus provided with a light source for emitting illumination light of a wavelength of not more than about 200 nm, comprising:

a substrate comprised by silica glass doped with fluorine and having a chlorine concentration of not more than 50 ppm and a pattern formed on the substrate.

23. A photomask as set forth in claim 22, wherein a concentration of a metal impurity in the silica glass is not more than 50 ppb.

24. A photomask as set forth in claim 1, wherein the substrate is a silica glass doped with fluorine.

25. A photomask as set forth in claim 11, wherein a chlorine concentration in the silica glass is not more than 50 ppm.

26. A photomask as set forth in claims 25, wherein a concentration of a metal impurity in the silica glass is not more than 50 ppb.

27. A photomask as set forth in claim 19, wherein a chlorine concentration in the silica glass is not more than 50 ppm.

28. A photomask as set forth in claim 27, wherein a concentration of a metal impurity in the silica glass is not more than 50 ppb.

29. A photomask as set forth in claim 21, wherein a concentration of a metal impurity in the silica glass is not more than 50 ppb.

30. A photomask as set forth in claim 1, wherein said protective film is formed at a side face of the substrate.

* * * * *